United States Patent
Yoon

(10) Patent No.: US 8,496,841 B2
(45) Date of Patent: Jul. 30, 2013

(54) NANO PATTERNING METHOD AND METHODS FOR FABRICATING SURFACE PLASMON COLOR FILTER AND LIQUID CRYSTAL DISPLAY DEVICE USING THE SAME

(75) Inventor: Min-Sung Yoon, Gyeongsangbuk-Do (KR)

(73) Assignee: LG Display Co., Ltd., Seoul (KR)

( * ) Notice: Subject to any disclaimer, the term of this patent is extended or adjusted under 35 U.S.C. 154(b) by 303 days.

(21) Appl. No.: 13/075,836

(22) Filed: Mar. 30, 2011

(65) Prior Publication Data

US 2011/0269364 A1  Nov. 3, 2011

(30) Foreign Application Priority Data

Apr. 29, 2010  (KR) .................. 10-2010-0040267

(51) Int. Cl.
*G01D 15/00* (2006.01)
*G11B 5/127* (2006.01)

(52) U.S. Cl.
USPC .................. 216/27; 216/39; 216/41; 216/84

(58) Field of Classification Search
None
See application file for complete search history.

(56) References Cited

U.S. PATENT DOCUMENTS

| 2005/0123687 A1* | 6/2005 | Jacobs et al. | 427/457 |
| 2005/0253137 A1* | 11/2005 | Whang et al. | 257/40 |
| 2007/0107614 A1* | 5/2007 | Lee et al. | 101/368 |

* cited by examiner

*Primary Examiner* — Duy Deo
(74) *Attorney, Agent, or Firm* — Morgan, Lewis & Bockius LLP

(57) ABSTRACT

Disclosed are a nano patterning method for fabricating a surface plasmon color filter having a transmissive pattern which selectively transmits light of specific wavelengths, and methods for fabricating a surface plasmon color filter and a liquid crystal display (LCD) device using the same. Used are a stamp which provides a partial electrification region, and a template, thiol-terminated nanospheres which can be self-assembled, thereby fabricating nano holes having a two-dimensional period and arranged in a hexagonal lattice. This may be applied onto a large area of a substrate, and may implement simplified processes and reduced fabrication costs.

20 Claims, 26 Drawing Sheets

UNIT CELL

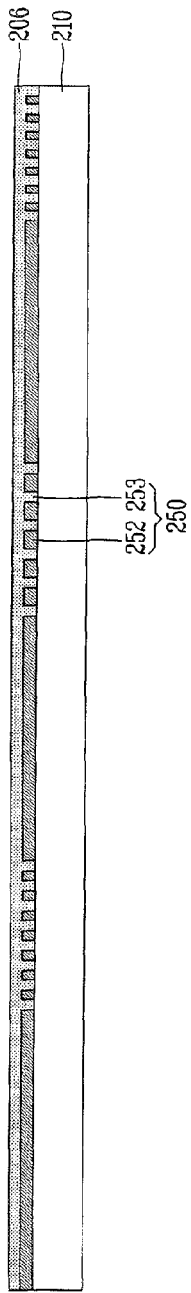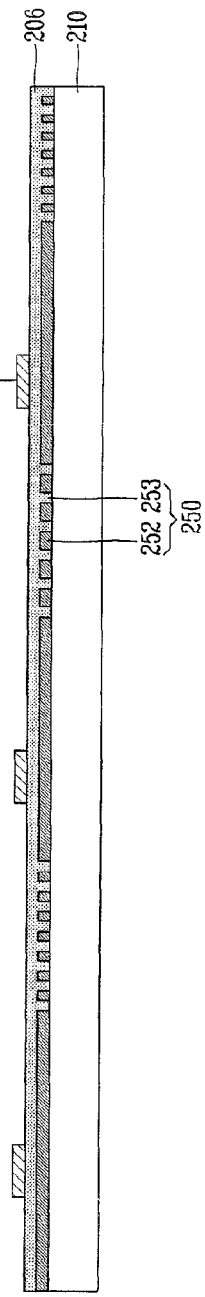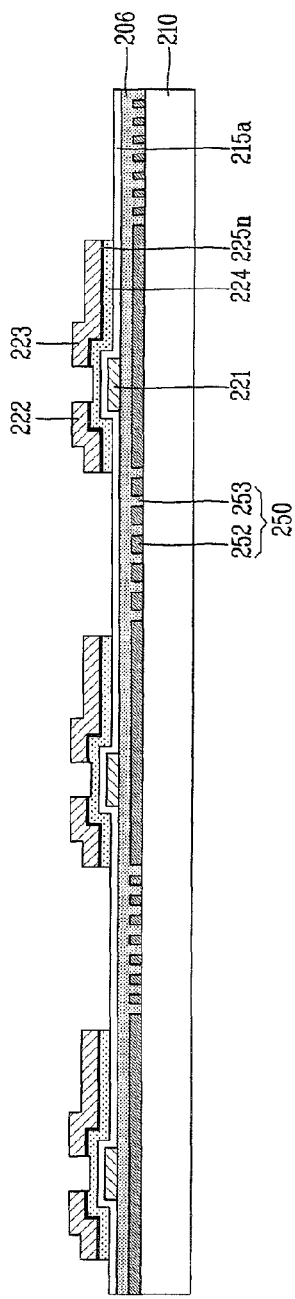

NANO PATTERNING METHOD AND METHODS FOR FABRICATING SURFACE PLASMON COLOR FILTER AND LIQUID CRYSTAL DISPLAY DEVICE USING THE SAME

CROSS-REFERENCE TO RELATED APPLICATION

Pursuant to 35 U.S.C. §119(a), this application claims the benefit of earlier filing date and right of priority to Korean Application No. 10-2010-0040267, filed on Apr. 29, 2010, the contents of which is incorporated by reference herein in its entirety.

1. FIELD OF THE INVENTION

This specification relates to a nano patterning method using self assembly characteristics, and methods for fabricating a surface plasmon color filter and a liquid crystal display (LCD) device using the same, and particularly, to a nano patterning method for fabricating a surface plasmon color filter having a transmissive pattern which selectively transmits light of specific wavelengths, and methods for fabricating a surface plasmon color filter and a liquid crystal display (LCD) device using the same.

2. DESCRIPTION OF THE RELATED ART

As concerns about an information displays and demands for portable information media are increased, research and commercialization of flat panel displays (FPD) replacing the related art display apparatus, Cathode Ray Tubes (CRT) are actively ongoing. One of these flat panel displays, a Liquid Crystal Display (LCD) device serves to display an image by using optical anisotropy of a liquid crystal (LC). Owing to an excellent resolution, color reproduction characteristic, and picture quality, the LCD device is being actively applied to a notebook, a desk top monitor, etc.

The LCD device is largely comprised of a color filter substrate, an array substrate, and an LC layer interposed between the color filter substrate and the array substrate.

The LCD device is fabricated through a plural number of mask processes (i.e., photo lithography process). Accordingly, required is a method for reducing the number of mask processes for enhanced productivity.

Hereinafter, a structure of the related art LCD device will be explained in more detail with reference to FIG. 1.

FIG. 1 is a disassembled perspective view schematically showing a structure of the related art LCD.

As shown in FIG. 1, the LCD device largely comprises a color filter substrate 5, an array substrate 10, and an LC layer 30 interposed between the color filter substrate 5 and the array substrate 10.

The color filter substrate 5 consists of a color filter (C) consisting of a plurality of sub color filters 7 for implementing red, green and blue (RGB) colors, a black matrix 6 for dividing the sub color filters 7 from each other and shielding light passing through the LC layer 30, and a transparent common electrode 8 for applying a voltage to the LC layer 30.

The array substrate 10 consists of a plurality of gate lines 16 and data lines 17 arranged in horizontal and vertical directions to define a plurality of pixel regions (P), Thin Film Transistors (TFT), switching devices formed at intersections between the gate lines 16 and the data lines 17, and pixel electrodes 18 formed in the pixel regions (P).

The color filter substrate 5 and the array substrate 10 facing each other are bonded to each other by a sealant (not shown) formed on an outer periphery of an image display region, thereby constituting an LC panel. The color filter substrate 5 and the array substrate 10 are bonded to each other by bonding keys (not shown) formed at the color filter substrate 5 or the array substrate 10.

In order to prevent light leakage due to an align error when bonding the two substrates to each other, a line width of the black matrix is set to be wide, thereby obtaining an align margin. This may reduce an aperture ratio of the LC panel.

The related art color filter used in the LCD device implements colors by absorbing light of unnecessary colors for disappearance with using pigments or dyes, and by selectively transmitting light of desired colors. This may allow only one of RGB colors, from white incident light, to be transmitted to one sub-pixel. Accordingly, it is difficult to have a transmittance rate more than 30%. Due to this low transmittance rate of the LC panel, power consumption by a backlight is increased.

FIG. 2 is an exemplary view schematically showing a transmittance rate of the LC panel when applying a color filter using a general pigment dispersing method.

Referring to FIG. 2, as light incident from a backlight has a decreased optical amount decreased while sequentially passing through a polarizer, a TFT array, an LC and a color filter, a transmittance rate is reduced to 5% or less than.

Here, the polarizer, the TFT array and the color filter approximately have transmittance rates of ~40%, 45~55% and ~25%, respectively.

The related art color filter is fabricated with complicated processes since it repeatedly undergoes color resist coating, exposure to light, development and curing processes according to each color.

Nano patterning technologies having a high degree of integration include a photolithography using light or particle beams, an electron beam lithography, a laser interference lithography, etc. According to these lithography technologies, a photoresist, a chemical material reactive to irradiated light is used, and an etching process is performed to form a pattern.

However, the related art lithography technologies may have the following disadvantages. Firstly, devices or processes require high costs, and include complicated processes. Accordingly, it takes a long time to perform the entire processes. Furthermore, it is limited to develop polymers used as a photoresist under a UV wavelength and to develop equipment. Especially, the electron beam lithography is an expensive processing technology using a sequential writing method which requires a long processing time.

On the other hand, a nano-imprint technology is being developed to repeatedly fabricate patterns or structures by applying an organic material to a flexible polymer stamp not using light or large energy particles. According to this nano-imprint technology, a stamp having a nano-scale structure is fabricated by using an electron beam lithography. Then, this stamp is printed on a polymer thin film to transfer the nano-scale structure. Then, this structure is repeatedly used to solve a production problem of the electron beam lithography. Furthermore, a 'step-and-repeat' method is being actively developed. According to the step- and repeat method, a stamp having a small area is fabricated to perform an imprint process on a part of a substrate. Then, the stamp is moved to perform repeated processes.

The size of the stamp determines a pattern area that can be printed at one time, which plays an important role to determine the productivity of nano-imprint. Furthermore, high costs are required when fabricating, by an electron beam lithography, a stamp having a large area of a high-density nano pattern. The 'step-and-repeat' method serves to sequentially perform repeat printings by using a stamp having a size equal to a predetermined substrate size. Accordingly, the productivity per hour is lower than in the related art method for printing on an entire area of a substrate at one time. More concretely, a maximum size of a template stamp or a master mould which can be fabricated by the current technology is less than 10 inches. And, the master mould serves to form a pattern by using the related art electron beam lithography. Accordingly, it is expensive to fabricate the master mould. Furthermore, since a sequential repeat printing method is adopted, the productivity per hour may be degraded as a pattern area is increased.

SUMMARY OF THE INVENTION

Therefore, an aspect of the detailed description is to provide a method for fabricating a surface plasmon color filter capable of enhancing an aperture ratio and a transmittance rate of an LC panel, by forming a color filter having an enhanced transmittance rate by using a surface plasmon instead of using the general dyes or pigments, and a method for fabricating a liquid crystal display (LCD) device having the same.

Another aspect of the detailed description is to provide a method for fabricating a surface plasmon color filter capable of enhancing an aperture ratio by changing hole arrangements of a transmissive pattern, and a method for fabricating an LCD device having the same.

Still another aspect of the detailed description is to provide a nano patterning method capable of simplifying processes, reducing fabrication costs, and being applied onto a large area of a substrate, and methods for fabricating a surface plasmon color filter and an LCD device using the same.

To achieve these and other advantages and in accordance with the purpose of this specification, as embodied and broadly described herein, there is provided a nano patterning method comprising: forming a polymer film having an electrification property on a surface of a stamp having convexed portions; contacting the stamp having the polymer film formed thereon, on a surface of a substrate, and applying a voltage between a metal layer of the stamp and the substrate; separating the stamp from the substrate, and transferring, onto the substrate, a remaining polymer film having an electrification region charged with negative charges (−) or positive charges (+); immersing the substrate including the remaining polymer film in a solution where thiol-terminated nanospheres are dissolved, thereby forming a nanosphere colloidal mono layer on a surface of the remaining polymer film in a self assembly manner; removing polymers absorbed to surfaces of the nanospheres, and an exposed portion of the polymer film except for a portion covered by the nanospheres; depositing a predetermined thin film on an entire surface of the substrate including a pattern of the nanospheres; and selectively removing the nanospheres and the thin film deposited above the nanospheres, thereby forming, on the substrate, a plurality of nano holes arranged in a hexagonal lattice with a predetermined period.

To achieve these and other advantages and in accordance with the purpose of this specification, as embodied and broadly described herein, there is also provided a method for fabricating a surface plasmon color filter, the method comprising: forming a polymer film having an electrification property on a surface of a stamp having convexed portions; contacting the stamp having the polymer film formed thereon, on a surface of a substrate, and applying a voltage between a metal layer of the stamp and the substrate; separating the stamp from the substrate, and transferring, onto the substrate, a remaining polymer film having an electrification region charged with negative charges (−) or positive charges (+); immersing the substrate including the remaining polymer film in a solution where thiol-terminated nanospheres are dissolved, thereby forming a nanosphere colloidal monolayer on a surface of the remaining polymer film in a self assembly manner; removing polymers absorbed to surfaces of the nanospheres, and an exposed portion of the polymer film except for a portion covered by the nanospheres; depositing a conductive film on an entire surface of the substrate including a pattern of the nanospheres; and selectively removing the nanospheres and the conductive film deposited above the nanospheres, thereby forming, on the substrate, a plurality of nano holes arranged in a hexagonal lattice with a predetermined period, wherein a desired color is implemented by selectively transmitting light of a specific wavelength, by forming, in a metallic film formed of the conductive film, a transmissive pattern consisting of the plurality of nano holes having a predetermined period.

To achieve these and other advantages and in accordance with the purpose of this specification, as embodied and broadly described herein, there is still also provided a method for fabricating a liquid crystal display (LCD) device, the method comprising: preparing a first substrate and a second substrate; forming a polymer film having an electrification property on a surface of a stamp having convexed portions; contacting the stamp having the polymer film formed thereon, on a surface of the first substrate, and applying a voltage between a metal layer of the stamp and the first substrate; separating the stamp from the first substrate, and transferring, onto the first substrate, a remaining polymer film having an electrification region charged with negative charges (−) or positive charges (+); immersing the first substrate including the remaining polymer film in a solution where thiol-terminated nanospheres are dissolved, thereby forming a nanosphere colloidal monolayer on a surface of the remaining polymer film in a self assembly manner; removing polymers absorbed to surfaces of the nanospheres, and an exposed portion of the polymer film except for a portion covered by the nanospheres; depositing a conductive film on an entire surface of the first substrate including a pattern of the nanospheres; selectively removing the nanospheres and the conductive film deposited above the nanospheres, thereby forming, on the first substrate, a plurality of nano holes arranged in a hexagonal lattice with a predetermined period, wherein a color filter for implementing a desired color by selectively transmitting light of a specific wavelength is formed by forming, in a metallic film formed of the conductive film, a transmissive pattern consisting of the plurality of nano holes having a predetermined period; forming a thin film transistor (TFT) on the color filter; and bonding the first and second substrates to each other.

According to another aspect of the present invention, there is provided a method for fabricating a liquid crystal display (LCD) device, the method comprising: preparing a first substrate and a second substrate; forming a thin film transistor (TFT) on the first substrate; forming a polymer film having an electrification property on a surface of a stamp having convexed portions; contacting the stamp having the polymer film formed thereon, on a surface of the second substrate, and applying a voltage between a metal layer of the stamp and the second substrate; separating the stamp from the second substrate, and transferring, onto the second substrate, a remaining polymer film having an electrification region charged with negative charges (−) or positive charges (+); immersing the second substrate including the remaining polymer film in a solution where thiol-terminated nanospheres are dissolved, thereby forming a nanosphere colloidal monolayer on a surface of the remaining polymer film in a self assembly manner; removing polymers absorbed to surfaces of the nanospheres, and an exposed portion of the polymer film except for a portion covered by the nanospheres; depositing a conductive film on an entire surface of the second substrate including a pattern of the nanospheres; selectively removing the nanospheres and the conductive film deposited above the nanospheres, thereby forming, on the second substrate, a plurality of nano holes arranged in a hexagonal lattice with a predetermined period, wherein a color filter for implementing a desired color by selectively transmitting light of a specific wavelength is formed by forming, in a metallic film formed of the conductive film, a transmissive pattern consisting of the plurality of nano holes having a predetermined period; and bonding the first and second substrates to each other.

The present invention may have the following advantages.

According to the nano patterning method of the present invention, two-dimensional nano holes arranged in a hexagonal lattice and having a period may be fabricated by using the stamp which provides a partial electrification region, and the template, the thiol-terminated nanospheres which can undergo a self assembly process. This may allow a surface plasmon color filter and an LCD device to be fabricated through simplified processes and with low costs.

According to the methods for fabricating a surface plasmon color filter and an LCD device having the same, a color filter having a simplified structure may be formed by using a surface plasmon phenomenon, instead of using the general dyes or pigments. This may simplify fabrication processes, and reduce fabrication costs.

According to the methods for fabricating a surface Plasmon color filter and an LCD device having the same, a hexagonal lattice structure may be adopted such that six nearest holes are positioned near one hole of the transmissive pattern. This may enhance an aperture ratio more than in a square lattice structure by 15% or more. As a result, a full color filter which provides excellent monochromaticity and transmittance rate may be implemented. A size of the holes of the surface plasmon color filter may be controlled by a diameter of the nanospheres, and a lattice period of the holes may be determined by controlling a length of the thiol-terminated polymers.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings:

FIGS. 5A to 5C and 4B are planar views showing a color filter having a hexagonal lattice structure according to a second embodiment of the present invention;

FIGS. 14A to 14F are sectional views sequentially showing processes for fabricating the LCD device shown in FIG. 12.

DETAILED DESCRIPTION OF THE INVENTION

Description will now be given in detail of the exemplary embodiments, with reference to the accompanying drawings. For the sake of brief description with reference to the drawings, the same or equivalent components will be provided with the same reference numbers, and description thereof will not be repeated.

Hereinafter, a method for fabricating a surface plasmon color filter using a nano patterning according to the present invention will be explained in more details with reference to the attached drawings.

The general method for enhancing a transmittance rate of an LC panel by improving an aperture ratio of an array substrate has many limitations. Accordingly, the general paradigm has to be changed into a new paradigm for enhancing a transmittance rate of an LC panel by removing a color filter, rather than by improving an aperture ratio.

For this, has been proposed a method for filtering light by forming a transmissive pattern at a metallic film so that light of a specific wavelength can be selectively transmitted. The present invention is to provide a color filter capable of transmitting RGB colors by forming a metallic film using a surface plasmon.

Figure 1:
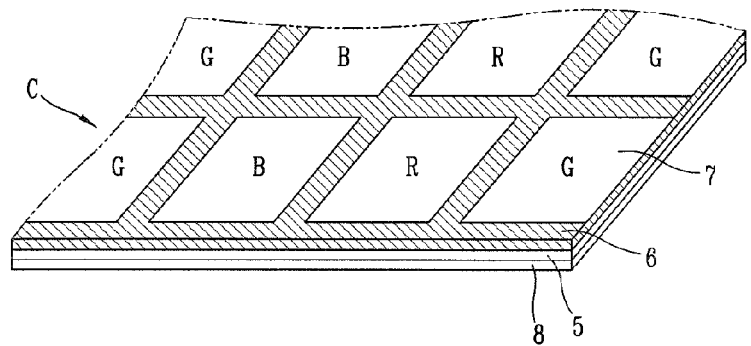
FIG. 1 is an exploded perspective view schematically showing a structure of a liquid crystal display (LCD) device in accordance with the related art.
Figure 1:
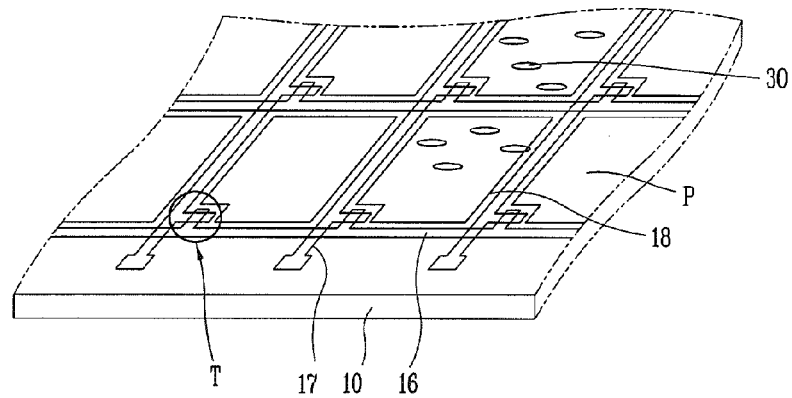
Figure 2:
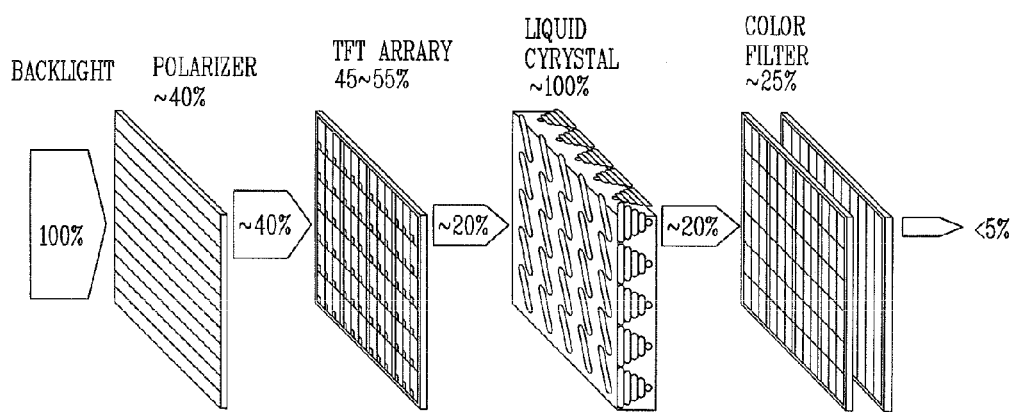
FIG. 2 is an exemplary view schematically showing a transmittance rate of an LC panel when applying a color filter using a general pigment dispersing method.
Figure 3A:
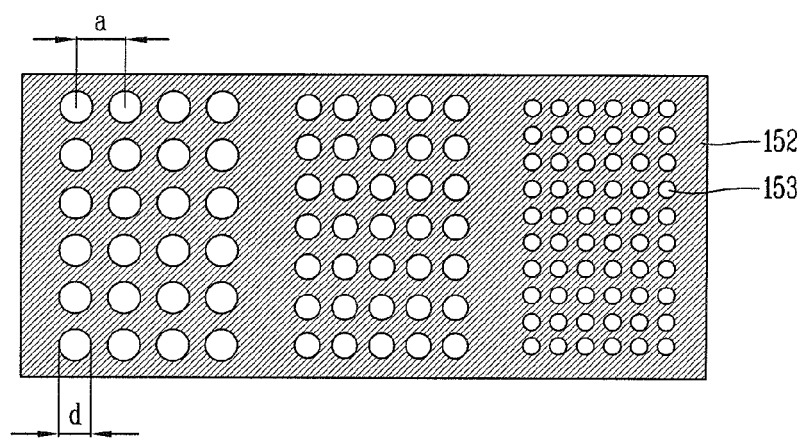
FIGS. 3A and 3B are respectively a planar view and a sectional view, which schematically show a structure of a color filter fabricated by using a surface plasmon phenomenon according to a first embodiment of the present invention.
Figure 3B:
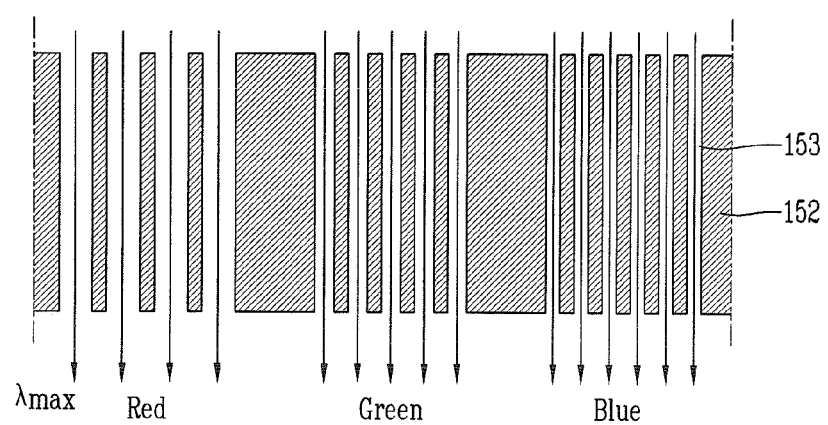

FIGS. 3A and 3B are respectively planar and sectional views schematically showing a structure of a color filter fabricated by using a surface plasmon phenomenon according to a first embodiment of the present invention.

Referring to FIG. 3, a transmissive pattern 153 consisting of a plurality of sub-wavelength holes having a predetermined period (L) is formed in a metallic film 152. An electric field of incident light having both a wavelength of near infrared light and a wavelength of visible light is coupled to a plasmon. Accordingly, only light of specific wavelengths is transmitted, and light of other wavelengths is reflected, thereby obtaining RGB colors.

For instance, if a sub-wavelength hole pattern having a predetermined period (L) is formed on a silver film, RGB light of specific wavelengths selected according to a size (d) and a period (L) of holes is transmitted, thereby implementing RGB colors. A greater amount of light than a hole area may be transmitted by absorbing light near the hole.

In order to implement a color of a high purity, each thickness of the metallic film 152 corresponding to each wavelength may be differently controlled. However, the present invention is not limited to this.

For your reference, the plasmon refers to a quasiparticle that free electrons induced on a surface of metal oscillate collectively by an electric field of incident light. A surface plasmon indicates that the plasmon partially exists on the metal surface, which corresponds to an electromagnetic wave that proceeds along an interface between the metal and a dielectric.

The surface plasmon phenomenon refers to forming light of a specific wavelength as light of a specific wavelength incident onto a surface of metal having a nano-sized periodic hole pattern resonates with free electrons on the metal surface. Only light of specific wavelengths is made to transmit through the hole, and light of other wavelengths is made to be reflected from the metal surface.

Generally, a thick metallic film can not transmit incident light. If a hole formed at the metallic film has a size much smaller than a wavelength of incident light, an intensity of transmitted light is significantly decreased. However, if the sub-wavelength small holes are periodically arranged at the metallic film, a transmittance rate of light is significantly increased due to excitation of a surface plasmon. Generally, a dispersion curve of light or photon does not cross a dispersion curve of a surface plasmon. In order to directly couple the photon to the surface plasmon, a grating structure of a hole pattern having a predetermined period is formed on the surface of the metallic film. This may satisfy the conservation of momentum, thereby causing the surface plasmon to be excited.

By controlling the transmissive pattern, i.e., a hole size, a gap between holes, a dielectric constant of a neighboring medium, a thickness of the metallic film, etc., light of a desired wavelength may be transmitted. In case of a metallic film provided with a square structure with holes having a period of 'a', a central peak wavelength of light perpendicularly incident onto the metallic film, i.e., a surface plasmon resonance wavelength may be obtained by the following Equation 1.

$$\lambda_{spp} = L\sqrt{\frac{\varepsilon_m \varepsilon_d}{\varepsilon_m + \varepsilon_d}}$$ [Equation 1]

Here, $\varepsilon_m$ indicates a dielectric constant of metal, and $\varepsilon_d$ indicates a dielectric constant of a dielectric material adjacent to the metal. That is, a peak wavelength of light transmitted by a surface plasmon may be controlled by changing a period of a transmissive pattern or by changing a dielectric material.

The transmissive pattern may have not only a circular shape such as a hole, but also various shapes such as an oval shape, a quadrangular shape, a triangular shape, and a slit shape. When the transmissive pattern has a circular shape, the hole may have has a diameter of 50 nm~10 μm and a period of 50~500 nm.

Figure 4A:
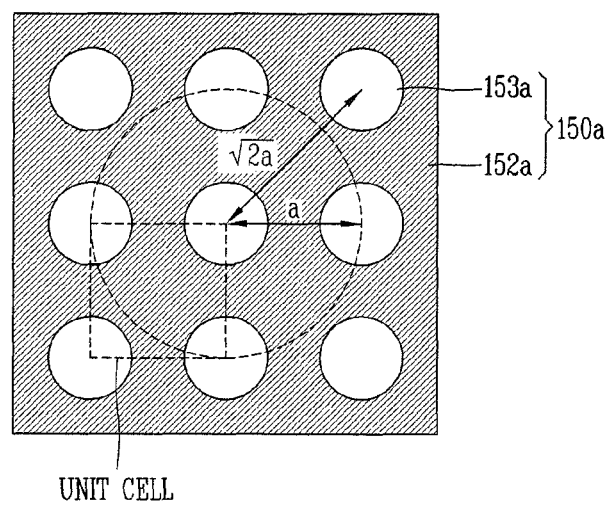
FIGS. 4A and 4B are planar views showing a color filter having a square lattice structure according to a first embodiment of the present invention.
Figure 4B:
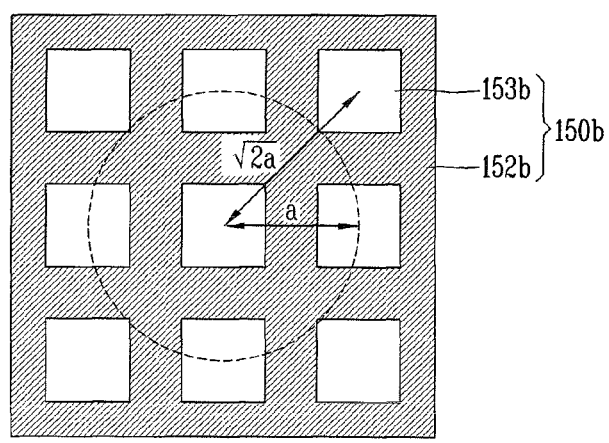

FIGS. 4A and 4B are planar views showing a color filter having a square lattice structure according to a first embodiment of the present invention, which schematically show a part of a color filter having a transmissive pattern consisting of circular holes, and a color filter having a transmissive pattern consisting of square holes, respectively.

As shown, the color filters 150a and 150b according to the first embodiment of the present invention implement desired colors by selectively transmitting light of a specific wavelengths, respectively, by forming transmissive patterns 153a and 153b consisting of a plurality of sub-wavelength holes having a constant period in row and column directions, on metallic films 152a and 152b.

Here, the color filters 150a and 150b according to the first embodiment of the present invention have holes periodically arranged in a square lattice.

A central peak wavelength of light transmitted to inside of the hole is proportional to a period 'a'. Also, an intensity of transmitted light is proportional to the number of the nearest holes or a hole density. Accordingly, a density of the nearest hole has only to be increased so as to enhance a color purity and a transmittance rate of transmitted light.

More concretely, in the square lattice structure, the number of the nearest holes spacing from the central hole by the period 'a' is 4, and the nearest holes are arranged in horizontal and vertical directions with respect to the central hole. A distance from the central hole to a next-nearest hole is 1.414 times of the lattice period. The next-nearest hole is arranged in a diagonal direction with respect to the central hole.

Geometrically, a density of the nearest hole in the square lattice structure is not higher than that in a hexagonal lattice structure. For instance, when forming transmissive patterns 153a and 153b with circular holes having a radius 'r', an area ratio between openings and non-openings per unit cell in a square lattice structure is $\pi r^2/a^2$, whereas an area ratio between openings and non-openings per unit cell in a hexagonal lattice structure is $1.15(\pi r^2/a^2)$. Therefore, it can be seen that the square lattice structure is not an optimized structure in the aspect of a transmittance rate and a color reproducibility.

For an optimized structure to improve a transmittance rate and a color reproducibility, a structure to enhance a density of the nearest hole from the central hole has to be selected. This will be explained in more details with reference to a second embodiment of the present invention.

Figure 5A:
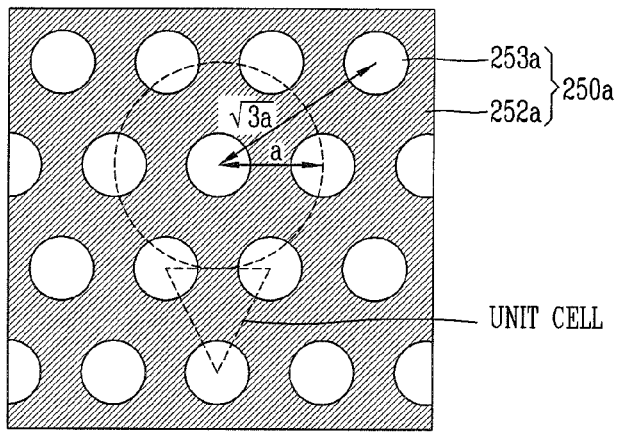
Figure 5B:
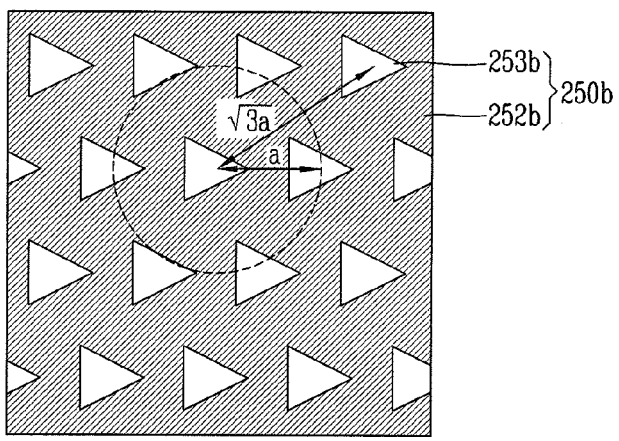
Figure 5C:
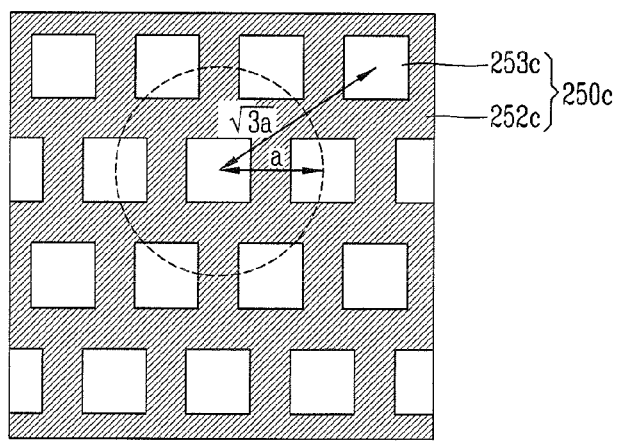

FIGS. 5A to 5C are planar views showing a color filter having a hexagonal lattice structure according to a second embodiment of the present invention, which schematically show a part of a color filter having a transmissive pattern consisting of circular holes, triangular holes and square holes, respectively.

As shown, the color filters 250a to 250c according to the second embodiment of the present invention implement desired colors by selectively transmitting light of a specific wavelengths, respectively, by forming transmissive patterns 253a to 253c consisting of a plurality of sub-wavelength holes having a constant period in row and column directions, on metallic films 252a to 252c.

Here, the color filters 250a to 250c according to the second embodiment of the present invention have holes periodically arranged in a hexagonal (or triangular) lattice. More concretely, the color filters 250a to 250c according to the second embodiment of the present invention have a hexagonal lattice structure in which six nearest holes are positioned around one hole of the transmissive patterns 253a~253c.

Here, a distance from the central hole to the nearest hole is equal to a lattice period, and a distance from the central hole to the next-nearest hole is 1.732 times of the lattice period.

As aforementioned, a cross-sectional shape of the holes of the transmissive patterns 253a to 253c may be one of a circular shape, a triangular shape, a square shape, an oval shape, and a shape of a slit having an aspect ratio more than 1. Here, the aspect ratio is defined as a ratio between a long axis length and a short axis length of a diagram.

Preferably, the metallic films 252a to 252c are formed of aluminum which can cause a surface plasmon resonance on all regions of visible light. However, the present invention is not limited to this. For instance, the metallic films 252a to 252c may be formed of a conductive material including at least one selected from a group consisting of Au, Ag, Pt, Cu, Ni, Pd, Zn, Fe, Cr, Mo, a doped semiconductor device, carbon nanotube, fullerene, conductive plastic and a conductive composite material rather than Al, or may be formed of a conductive material selected from a group consisting of mixture thereof.

The holes of the transmissive patterns 253a~253c preferably have a size of 100 nm~300 nm. However, the present invention is not limited to this. For instance, the holes may have a size of 50 nm~10 μm, and may have a period of 50 nm~500 nm.

Figure 6A:
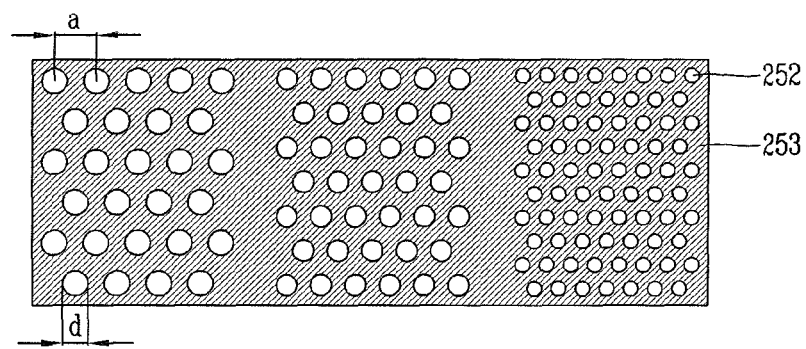
FIGS. 6A and 6B are respectively a planar view and a sectional view, which schematically show a structure of a color filter fabricated according to a second embodiment of the present invention.
Figure 6B:
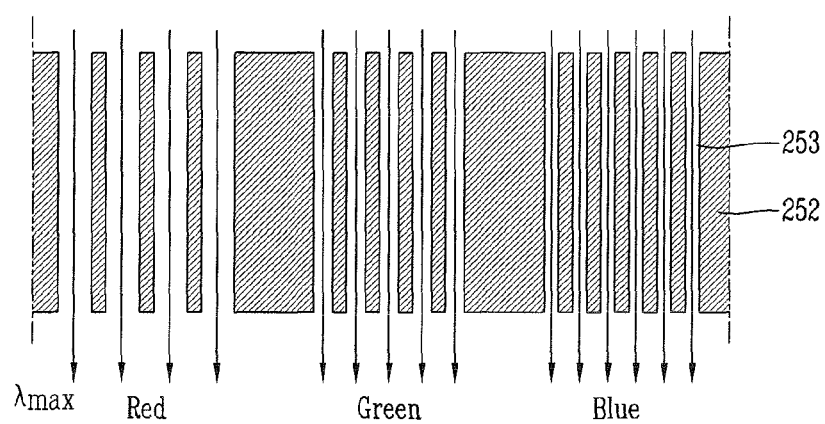

FIGS. 6A and 6B are respectively a planar view and a sectional view, which schematically show a structure of a color filter fabricated by a surface plasmon phenomenon according to a second embodiment of the present invention.

Referring to FIG. 6, the color filter according to the second embodiment of the present invention has a hexagonal lattice structure in which the holes of the transmissive pattern 253 are periodically arranged. Once the transmissive pattern 253 consisting of a plurality of sub-wavelength holes having a predetermined period (a) is formed in the metallic film 252, an electric field of incident light having both a wavelength of near infrared light and a wavelength of visible light is coupled to a plasmon. Accordingly, only light of specific wavelengths is transmitted, and light of other wavelengths is reflected, thereby obtaining RGB colors.

If light is incident from a lower side of the color filter substrate, only light of a specific wavelength determined by a lattice period of the transmissive pattern 253 is made to transmit the color filter substrate. More concretely, when the transmissive pattern 253 has a lattice period of 'a', a central peak wavelength of transmitted light may be designed as $\lambda=1.65$ sa. The same metallic film 252 is divided into a plurality of transmissive patterns 253 having different periods. Light having a different wavelength may selectively transmit each transmissive pattern 253.

When using aluminum having a thickness of 150 nm as the metallic film 252, a hole period (a) and a hole size (d) may be set as 394 nm and 197 nm, approximately so as to transmit red light having a central peak wavelength of 650 nm. A hole period (a) and a hole size (d) may be set as 333 nm and 167 nm, approximately so as to transmit green light having a central peak wavelength of 550 nm, and a hole period (a) and a hole size (d) may be set as 272 nm and 136 nm, approximately so as to transmit blue light having a central peak wavelength of 450 nm.

In order to implement a color having a high purity, a thickness of the metallic film 252 may be controlled to be different in correspondence to each wavelength. However, the present invention is not limited to this.

In the hexagonal lattice structure of the second embodiment, the number of the nearest holes is increased by 1.5 times than that in the square lattice structure of the first embodiment. And, in the hexagonal lattice structure of the second embodiment, an area ratio between openings and non-openings when the holes have a circular shape is increased by 1.15 times than that in the square lattice structure of the first embodiment, which may increase an aperture ratio by 15% or more. As a result, a full color filter having excellent monochromaticity and transmittance rate may be implemented. Furthermore, since a central peak wavelength of transmitted light can be controlled by changing a lattice period of the transmissive pattern on the same metallic film, colors of the color filter may be easily controlled.

In order to fabricate the surface plasmon color filter including nano-sized holes, a nano patterning method according to the present invention may be used. This will be explained in more details with reference to the attached drawings.

FIGS. 7A to 7I are sectional views sequentially showing a nano patterning method according to the present invention, and FIGS. 8A to 8F are planar views sequentially showing a nano patterning method according to the present invention.

FIGS. 7A to 7I and FIGS. 8A to 8F show a nano patterning method with respect to a sub color filter corresponding to one of red, green and blue colors. By performing the nano patterning method three times, a surface plasmon color filter including sub color filters of red, green and blue may be fabricated. However, the present invention is not limited to this.

Figure 7A:
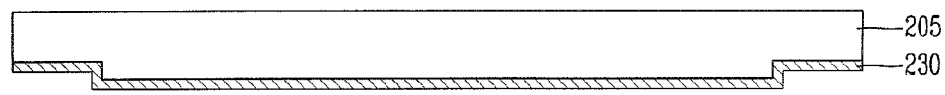
FIGS. 7A to 7I are sectional views sequentially showing a nano patterning method according to the present invention.

As shown in FIG. 7A, a polymer film 230 contacting a substrate and formed of a material having an electrification property is formed on a surface of a stamp 205 having convexed portions.

Here, the polymer film 230 is formed of one selected from a group consisting of polydimethylsiloxane (PDMS), polymethylmetaacrylate (PMMA), etc.

The convexed portions of the stamp 205 may be configured to have the same size or various sizes, and may be transformed according to a desired pattern. Especially, the convexed portions of the stamp 205 according to the present invention may have a shape corresponding to sub color filters of red, green and blue of a surface plasmon color filter to be formed.

For instance, the stamp 205 may be implemented as a metallic layer having convexed portions on a glass substrate. In this case, a metallic layer is formed on an entire surface of a glass substrate by a Plasma Enhanced Chemical Vapor Deposition (PECVD) method, a Low Pressure Chemical Vapor Deposition (LPCVD) method or a sputtering method.

Then, a photosensitive material, a photoresist is deposited on an entire surface of the metallic layer in a spin coating manner. Here, the photoresist may be a positive type photoresist or a negative type photoresist.

A mask having a light shielding portion and a light transmitting portion is positioned on the glass substrate having the photoresist deposited thereon. Then, ultraviolet rays are irradiated on the photoresist through the mask. Once the ultraviolet rays pass through the light transmitting portion of the mask, photoresist corresponding to the light transmitting portion of the mask is removed through a development process in case of using a positive type photoresist. As a result, a photoresist pattern is formed at a part corresponding to the light shielding portion of the mask. Then, the metallic layer is selectively etched through a dry etching by using the photoresist pattern formed on the metallic layer as a mask, thereby forming a metallic layer having convexed portions. Here, the convexed portions have a shape corresponding to sub color filters of red, green and blue of a surface plasmon color filter to be formed.

Then, PDMS or PMMA of a liquid status is deposited on the metallic layer having the convexed portions by one of spin coating, slit coating and spray deposition, thereby forming a layer formed of a polymer material. Then, the layer formed of a polymer material is cured by using light or heat, thereby forming a polymer film 230 on a surface of the metallic layer having the convexed portions.

Figure 7B:
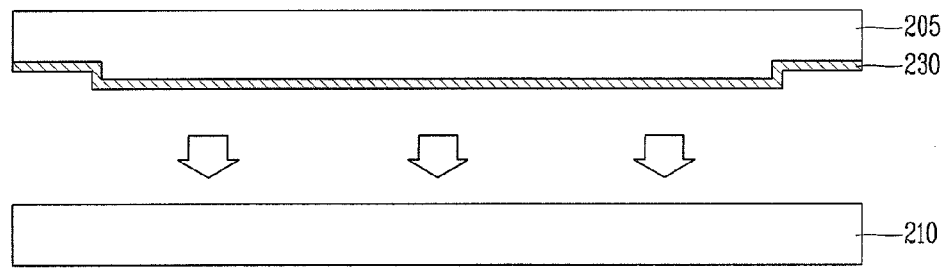
Figure 7C:
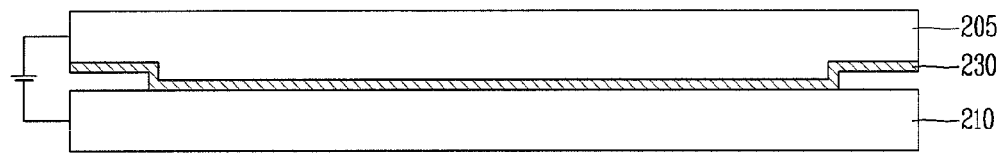

As shown in FIGS. 7B and 7C, the stamp 205 having the polymer film 230 thereon is made to contact a surface of a substrate 210. Then, an external voltage is applied to a space between the metallic layer of the stamp 205 and the substrate 210.

Here, the substrate 210 has to be a conductive substrate. However, when the substrate 210 is a non-conductive substrate, a conductive substrate is positioned below the substrate 210 to apply an external voltage to a space between the metallic layer of the stamp 205 and the conductive substrate. Alternatively, the substrate 210 is inserted into a sputtering chamber, and then a voltage is applied to a space between the metallic layer of the stamp 205 and a substrate supporting plate, thereby forming a predetermined electrification region.

Figure 7D:
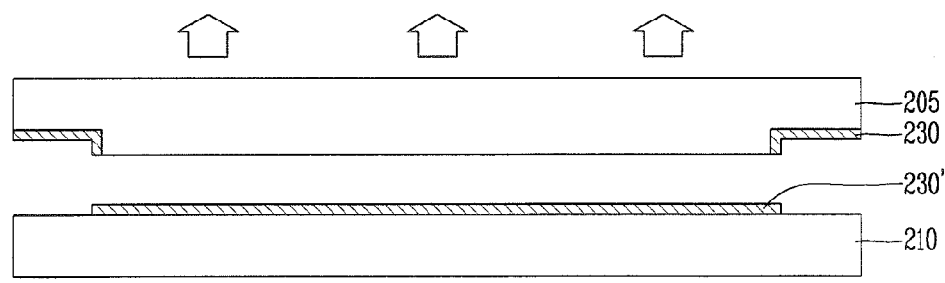
Figure 8A:
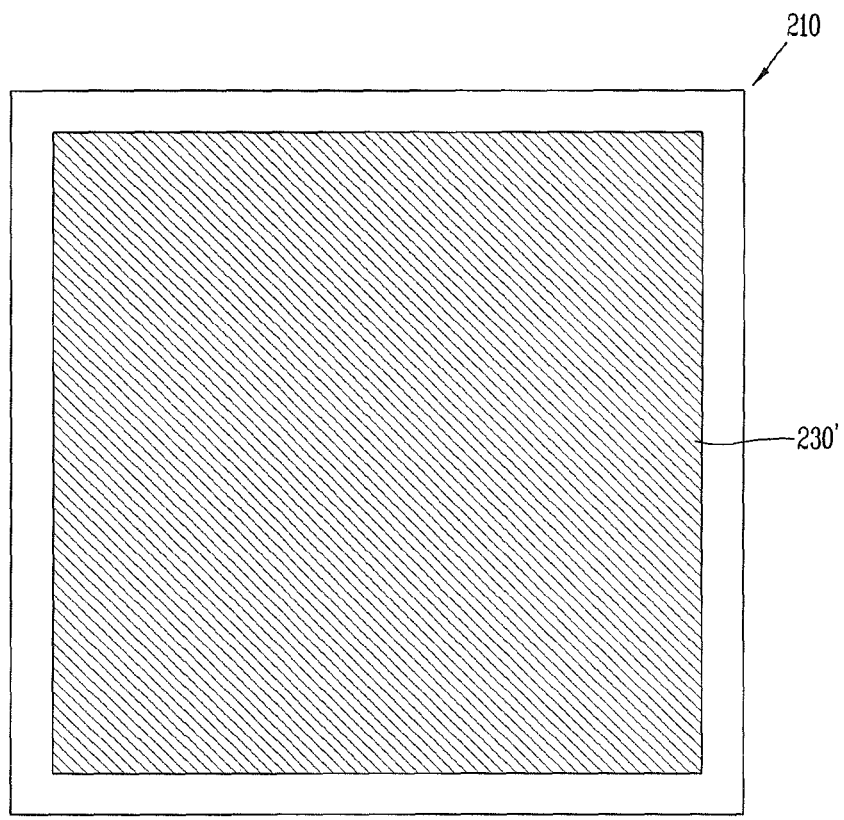
FIGS. 8A to 8F are planar views sequentially showing a nano patterning method according to the present invention.

As shown in FIGS. 7D and 8A, once the stamp 205 is separated from the substrate 210, a remaining polymer film 230' having an electrification region charged with negative or positive charges is transferred onto a part on the substrate 210.

Here, the remaining polymer film 230' has a shape corresponding to sub color filters of red, green and blue of a surface plasmon color filter to be formed, in the same manner as the convexed portions of the stamp 205.

Figure 7E:
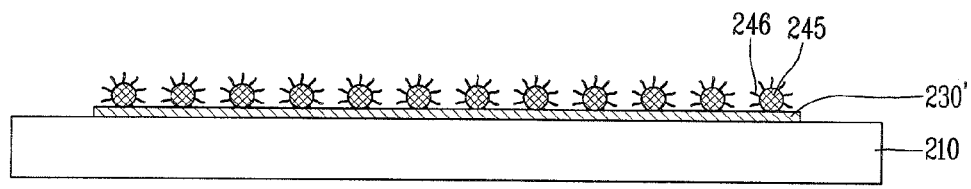
Figure 8B:
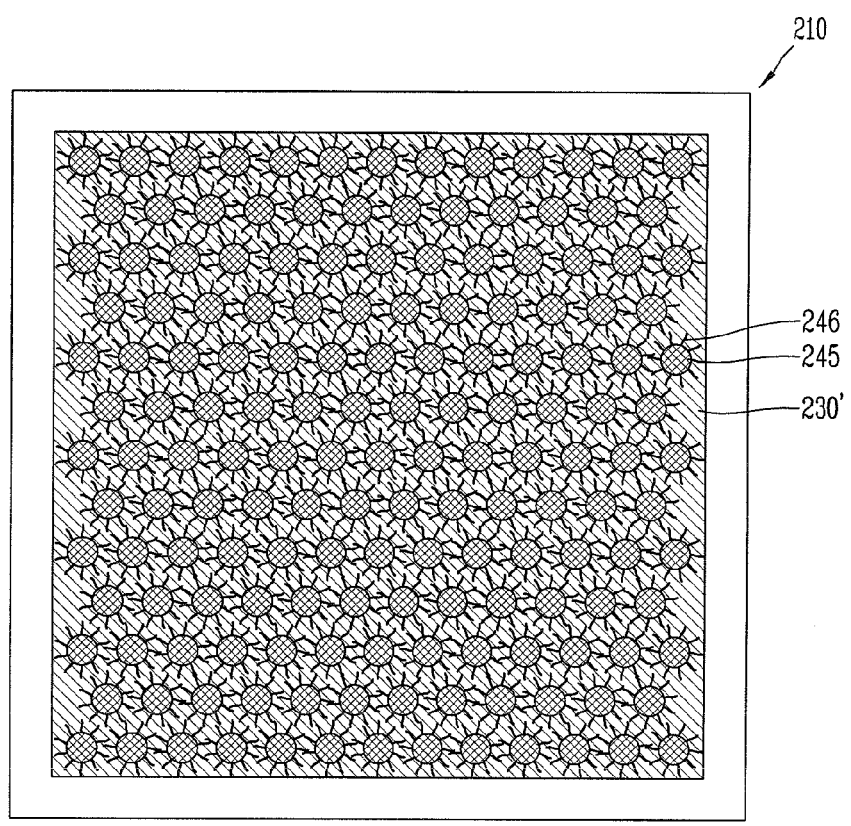

As shown in FIGS. 7E and 8B, the substrate 210 including the remaining polymer film 230' is immersed in a container where thiol-terminated nanospheres 245 are dissolved in a toluene solution, thereby forming a colloidal monolayer of two-dimensional nanospheres 245 on a surface of the remaining polymer film 230' in a self assembly manner.

Figure 9A:
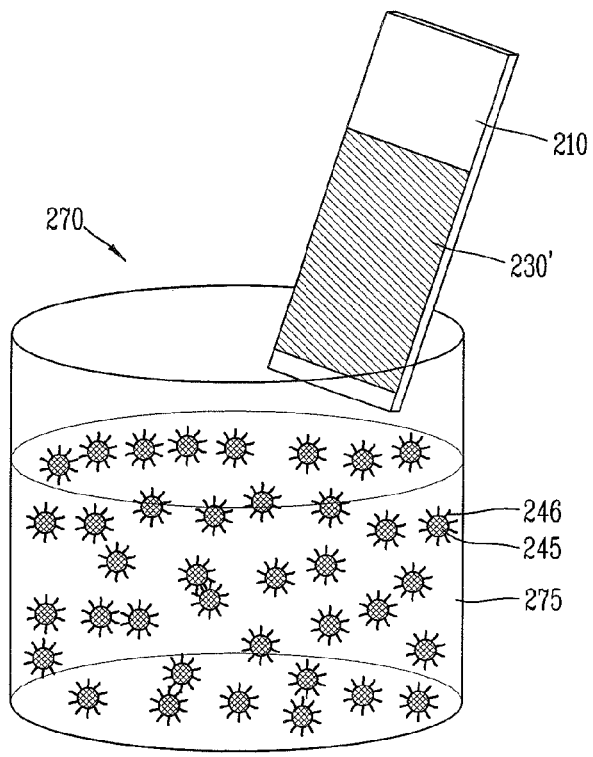
FIGS. 9A and 9B are exemplary views schematically showing a method for forming a self-assembled colloidal monolayer on an electrification film in the nano patterning method shown in FIGS. 7E and 8B.
Figure 9B:
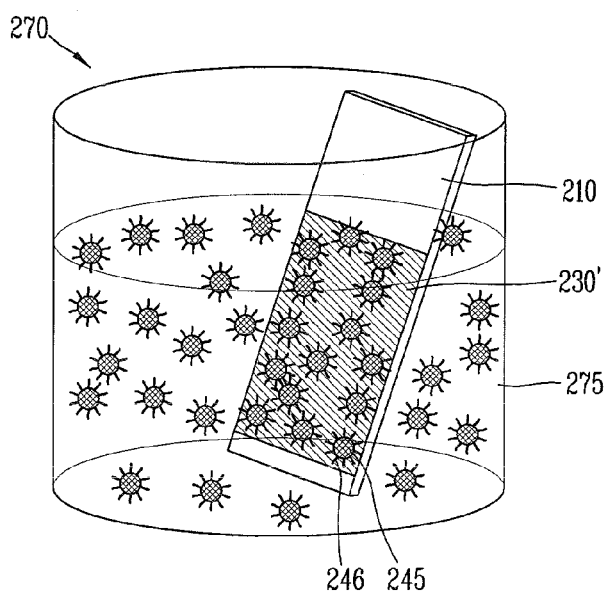
Figure 10:
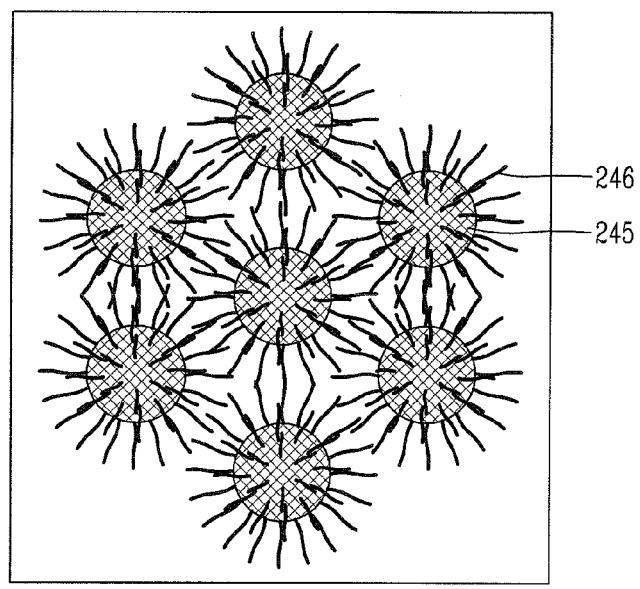
FIG. 10 is a mimetic diagram schematically showing a hexagonal lattice structure of nanospheres formed in a self assembly manner.

FIGS. 9A and 9B are exemplary views schematically showing a method for forming a self-assembled colloidal monolayer on an electrification film in the nano patterning method shown in FIGS. 7E and 8B. FIG. 10 is a mimetic diagram schematically showing a hexagonal lattice structure of nanospheres formed in a self assembly manner.

As shown in FIGS. 9A and 9B, the substrate 210 including the remaining polymer film 230' is immersed in a container 270 where thiol-terminated nanospheres 245 are dissolved, thereby forming a colloidal monolayer self-assembled by being partially collected on an electrification region of the remaining polymer film 230' by an electric attractive force.

Here, the nanospheres 245 self-assembled by being partially collected on an electrification region of the remaining polymer film 230' are arranged, on the two-dimensional plane, in a hexagonal lattice substantially equal to the hole pattern of the surface plasmon color filter according to the second embodiment of the present invention.

The nanospheres 245 may be formed of one selected from a group consisting of Si, Au, Ag, Cu, polystyrene, etc., and the substrate 210 is immersed in a toluene solution 275 where the thiol-terminated nanospheres 245 are dissolved.

Here, the thiol indicates an organic compound that sulfur atoms are substituted by oxygen atoms of alcohol and phenol. A polymer 246 having a thiol group may have a controlled length. By the controlled length of the polymer 246, a gap between the nanospheres 245, i.e., a lattice period of holes to be patterned by the nanospheres 245 is determined.

Then, a template that two-dimensional nanospheres 245 have been arranged on the substrate 210 in a self assembly manner is separated from the container 270.

Figure 7F:
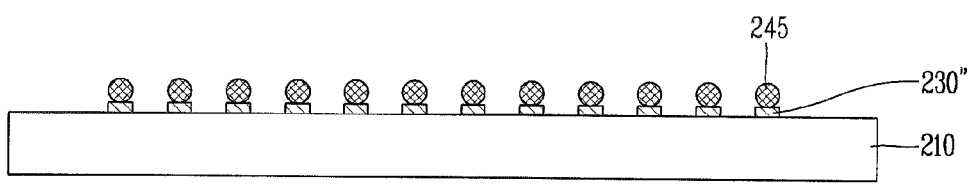
Figure 8C:
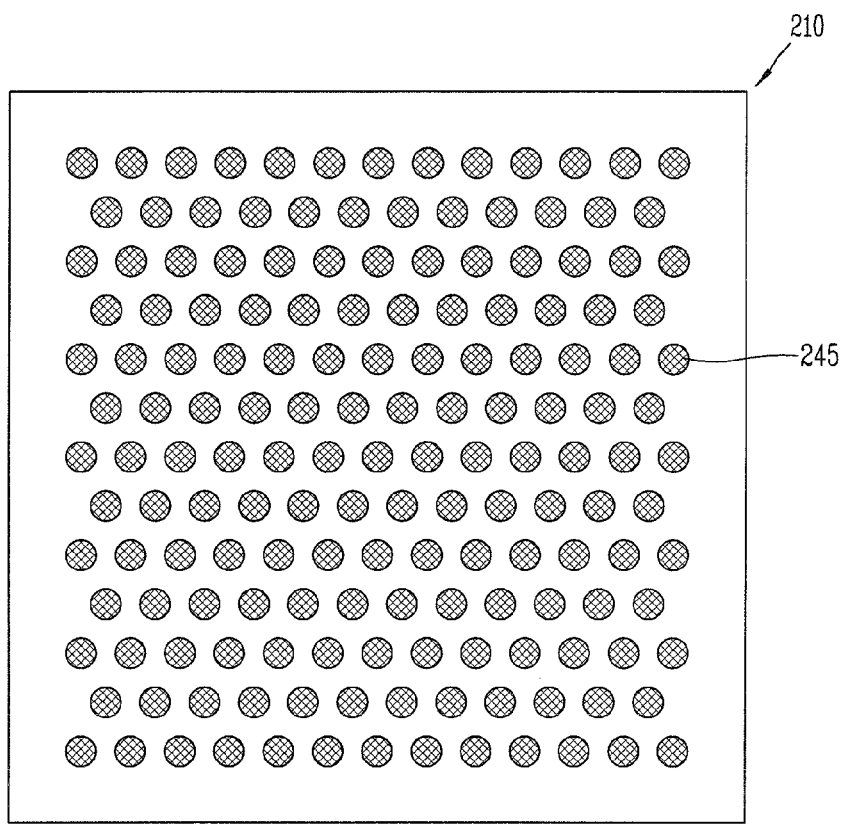

As shown in FIGS. 7F and 8C, the substrate 210 separated from the container 270 undergoes a Reactive Ion Etching (RIE) or an oxygen ($O_2$) plasma etching so as to be used as a template of a nano pattern. By the etching, removed are polymers on the surfaces of the nanospheres 245, and an exposed polymer film rather than a covered polymer film by the nanospheres 245, thereby forming a remaining polymer film pattern 230" patterned in the same form as the nanospheres 245.

Figure 7G:
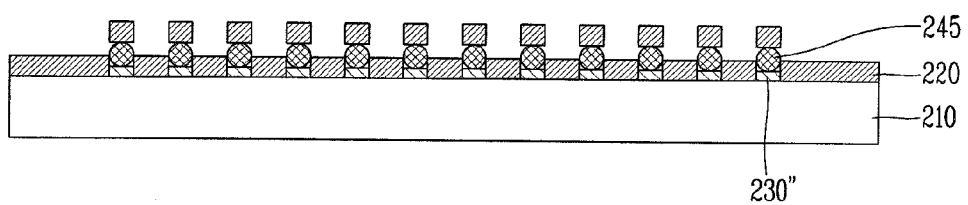
Figure 8D:
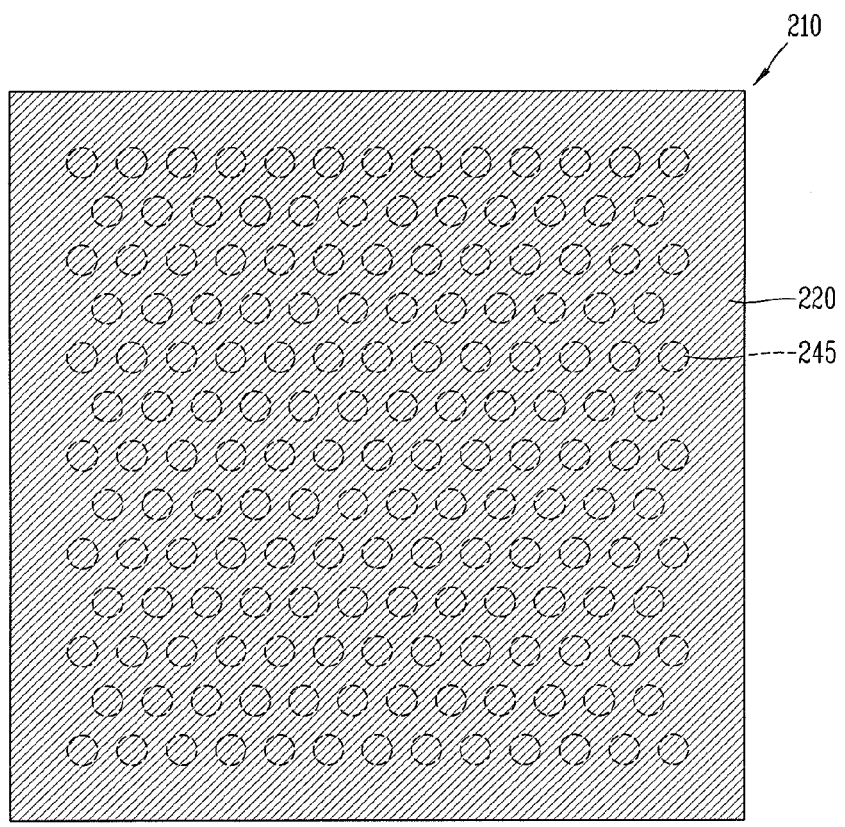

As shown in FIGS. 7G and 8D, a desired thin film for a device is deposited on an entire surface of the substrate 210 including the nanospheres 245. Here, the thin film for a device includes a material layer having a property of one of a conductor, a semiconductor device and a dielectric substance, or a combined property thereof. In case of fabricating a surface plasmon color filter, a predetermined conductive film 220 is deposited on an entire surface of the substrate 210.

Here, the conductive film 220 is formed to have a thickness substantially equal to a metallic film of a surface plasmon color filter to be formed, but thinner than a total thickness of the remaining polymer film pattern 230" and the nanospheres 245.

Preferably, the conductive film 220 is formed of aluminum which can cause a surface plasmon resonance on all regions of visible light. However, the present invention is not limited to this. For instance, the metallic film 220 may be formed of a conductive material including at least one selected from a group consisting of Au, Ag, Pt, Cu, Ni, Pd, Zn, Fe, Cr, Mo, a doped semiconductor device, carbon nanotube, fullerene, conductive plastic and a conductive composite material rather than Al, or may be formed of a conductive material selected from a group consisting of mixture thereof.

Figure 7H:
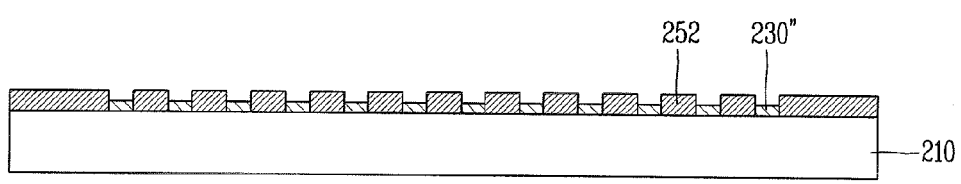
Figure 8E:
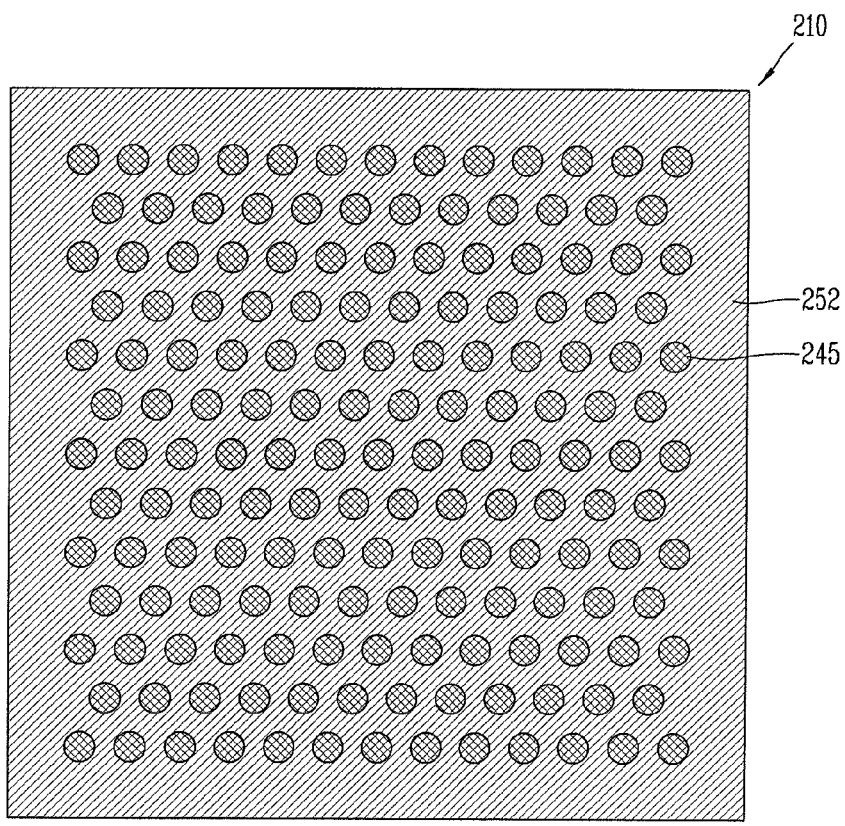

As shown in FIGS. 7H and 8E, the nanospheres are completely removed by using a solvent. Here, the conducive film deposited above the nanospheres are simultaneously removed when removing the nanospheres.

Figure 7I:
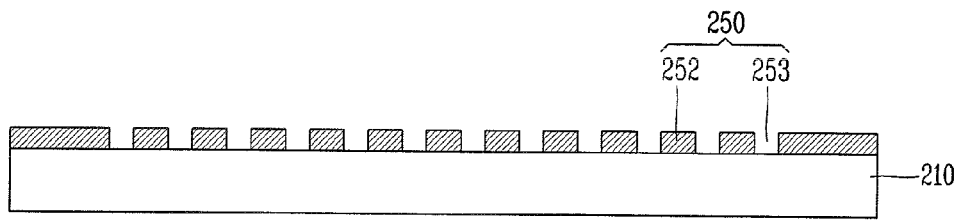
Figure 8F:
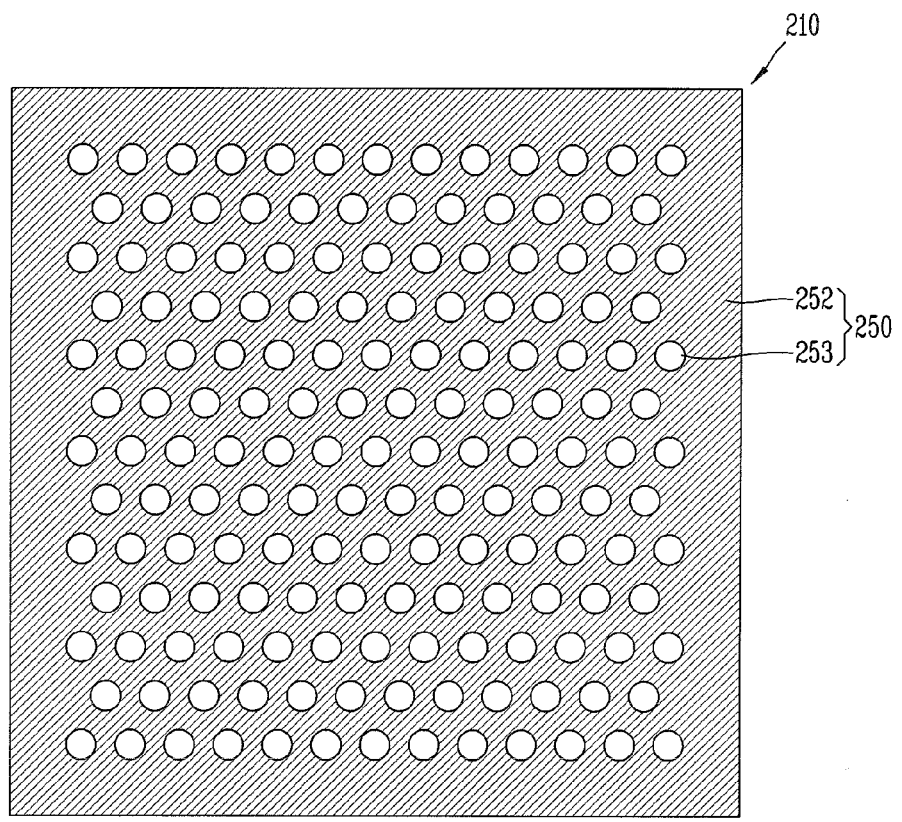

As shown in FIGS. 7I and 8F, once the remaining polymer film pattern is removed by an oxygen plasma etching, etc., the transmissive pattern 253 consisting of a plurality of sub-wavelength holes having a constant period is formed in the metallic film 252 formed of the conductive film. As a result, light of a specific wavelength is selectively transmitted to implement a desired color.

Here, the remaining polymer film pattern may be simultaneously removed when removing the nanospheres.

A size of the holes of the surface plasmon color filter is controlled by a size of the nanospheres, and a lattice period of the holes is determined by a controlled length of the thiol-terminated polymers. Accordingly, the present invention is to provide a method for periodically fabricating a two-dimensional nano pattern on a thin film for a device by using self assembly characteristics of nano materials.

The nano patterning method is performed three times, thereby fabricating a surface plasmon color filter including sub color filters of red, green and blue. However, the present invention is not limited to this.

In the nano patterning method and the method for fabricating a surface plasmon color filter using the same according to the present invention, used are a stamp which provides a partial electrification region, and a template, thiol-terminated nanospheres which can be self-assembled. This method may be applied onto a large area of a substrate, and may implement simplified processes and reduced fabrication costs.

The general color filter is formed on an upper color filter substrate. However, the surface plasmon color filter of the present invention is not limited to an upper color filter substrate, but may be formed on a lower array substrate or on an external surface of a substrate.

Differently from the related art where a pigment or dye type color filter cannot undergo a high temperature process, the metallic film serves as a color filter in the present invention. Accordingly, it is possible to fabricate a thin film transistor on the metallic film through a high temperature process. Furthermore, the color filter is formed on a lower array substrate, thereby solving the general problem that an LCD device has to decrease an aperture ratio in order to obtain an align margin for bonding an upper color filter substrate and a lower array substrate to each other.

Figure 11:
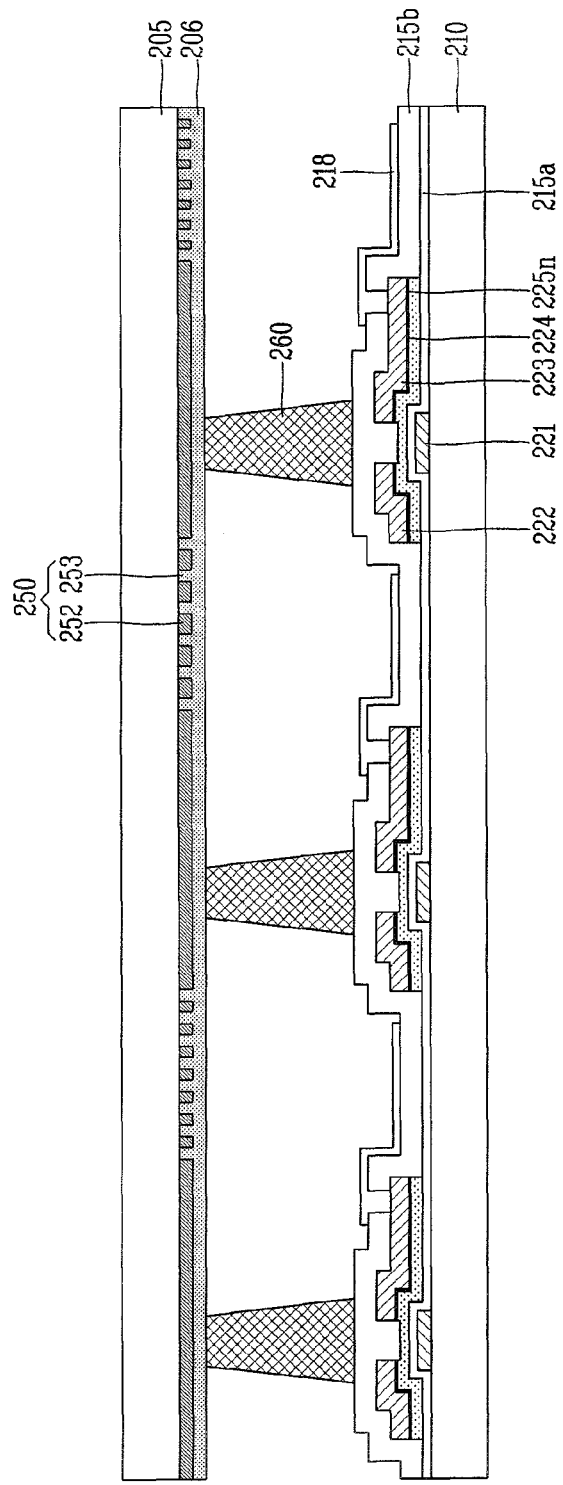
FIG. 11 is a sectional view schematically showing a structure of an LCD device according to a second embodiment of the present invention.
Figure 12:
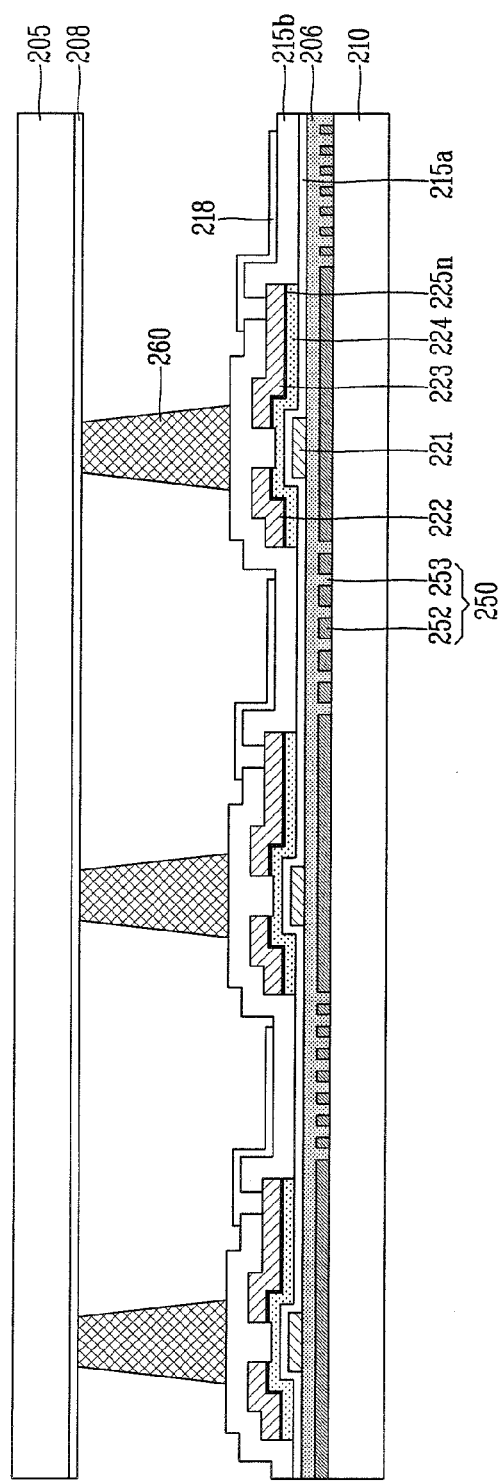
FIG. 12 is a sectional view schematically showing another structure of an LCD device according to a second embodiment of the present invention.

FIGS. 11 and 12 are sectional views schematically showing a structure of an LCD device according to a second embodiment of the present invention. For convenience, the same components are provided with the same reference numerals.

As aforementioned, the color filter for an LCD device according to the second embodiment of the present invention selectively transmits light of a specific wavelength to implement a desired color, by forming a transmissive pattern consisting of a plurality of sub-wavelength holes having a constant period in a metallic film in row and column directions.

Especially, the color filter according to the second embodiment of the present invention has a hexagonal lattice structure in which holes are periodically arranged. More concretely, the color filter according to the second embodiment of the present invention has a hexagonal lattice structure in which six nearest holes are positioned around one hole of the transmissive pattern.

As shown in FIG. 11, the surface plasmon color filter may be applied to an LCD device by forming a color filter 250 of the second embodiment on an upper color filter substrate 205.

This is advantageous in that RGB is implemented by forming a transmissive pattern on a single metallic film through 1-step processes, and the transmissive pattern is used as an upper ITO common electrode or a back electrode. This may simplify the entire processes to reduce the fabrication costs.

Here, the surface plasmon color filter 250 is advantageous to a color purity and a transmittance rate when a refractive index condition is satisfied between dielectric substances near the metallic film 252. Accordingly, in case of forming the color filter 250 on a glass substrate, an insulation layer 206 formed of the same dielectric material such as a silicon oxide film ($SiO_2$) as the glass substrate is preferably formed on the metallic film 252 including the transmissive pattern 253.

This color filter substrate 205 is bonded to the array substrate 210 by a sealant (not shown) formed at an outer periphery of an image display region in a state that a cell gap is maintained by a column spacer 260. On the array substrate 210, formed are a plurality of gate lines (not shown) which form a plurality of pixel regions by being arranged in horizontal and vertical directions, data lines (not shown), thin film transistors, switching devices formed at intersections between the gate lines and the data lines, and a pixel electrode 218 formed on the pixel region.

The thin film transistor consists of a gate electrode 221 connected to the gate line, a source electrode 222 connected to the data line, and a drain electrode 223 connected to the pixel electrode 218. And, the thin film transistor includes a first insulating layer 215a for insulation between the gate electrode 221 and the source/drain electrodes 222, 223, and an active layer 224 for forming a conductive channel between the source electrode and the drain electrode 223 by a gate voltage supplied to the gate electrode 221. Reference numerals 215b and 225n indicate ohmic contact layers for ohmic-contacting between a second insulating layer and the source/drain electrodes 222 and 223, and between the source/drain regions of the active layer 224 and the source/drain electrodes 222 and 223, respectively.

The surface plasmon color filter has an advantage that a damage does not occur even during a high temperature process since a metallic film is used. With consideration of this, a color filer may be formed on an array substrate.

As shown in FIG. 12, the surface plasmon color filter 250 may be formed inside a cell, i.e., below a TFT array. Although not shown, the surface plasmon color filter may be formed outside a cell, i.e., on an external surface of the array substrate 210.

In this case, a common electrode 208 rather than a color filter and a black matrix may be formed on the upper color filter substrate 205. The surface plasmon color filter 250 formed on the array substrate 210 may be floated or grounded. In case of forming the color filter 250 on the array substrate 210, a margin for aligning the upper color filter substrate 205 and the lower array substrate 210 is not required. This may allow an aperture ratio to be additionally obtained when designing a panel, and enhance a transmittance rate of an LC panel. If a transmittance rate of an LC panel is enhanced, a brightness level of a backlight may be lowered to reduce power consumption.

As power consumption of the backlight is decreased, multi-color pixels may be implemented to result in a high picture quality with real color reproduction.

In case of removing a color filter processing line by forming the color filter 250 on the array substrate 210, installation costs and construction costs may be reduced by about 50%.

Hereinafter, a structure of an LCD device where the surface plasmon color filter is formed on an array substrate, and a method for fabricating the same will be explained in more details with reference to the attached drawings.

Figure 13:
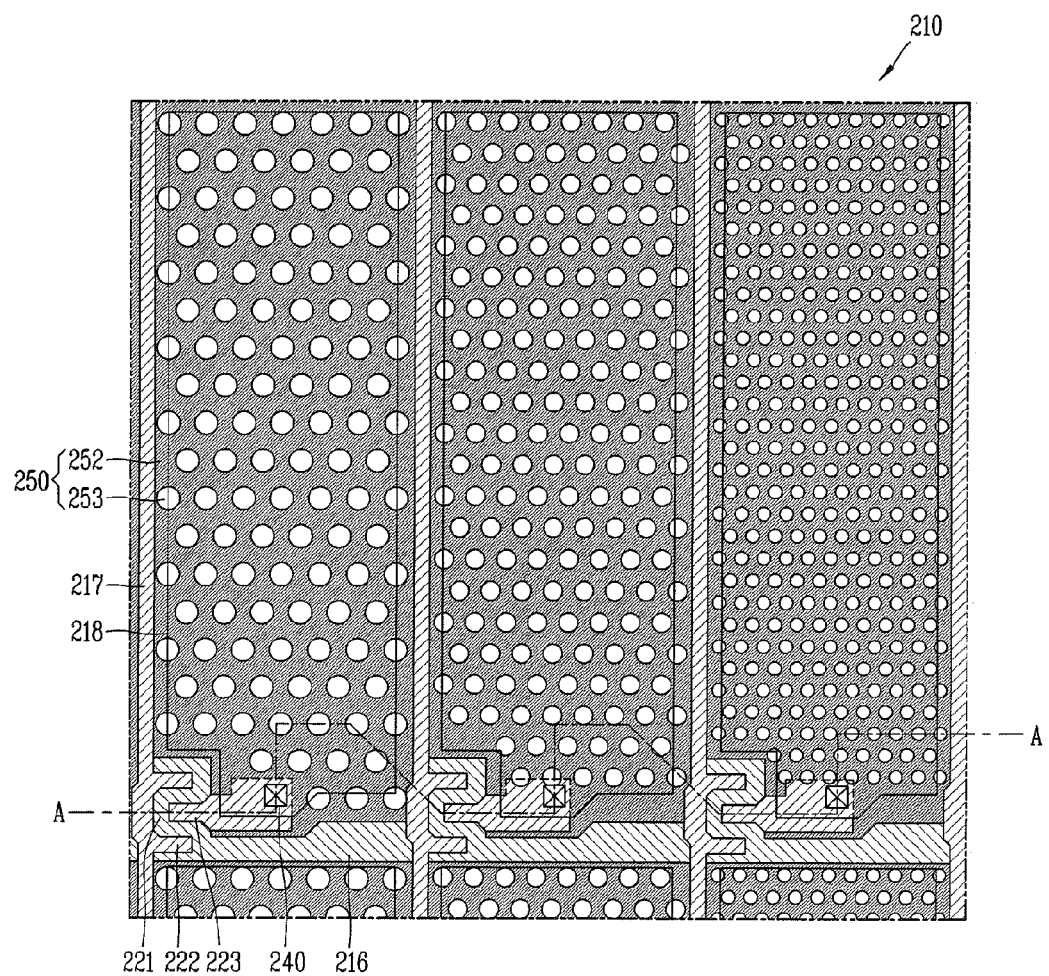
FIG. 13 is a planar view schematically showing a part of an array substrate of the LCD device according to a second embodiment of the present invention.

FIG. 13 is a planar view schematically showing a part of an array substrate of the LCD device of FIG. 12 according to a second embodiment of the present invention.

For convenience, FIG. 13 shows one pixel consisting of sub color filters corresponding to red, green and blue from the left side. However, the present invention is not limited to this, but may be also applied to a case where a plurality of colors more than three colors are implemented. The sub pixels corresponding to the red, green and blue have the same structure except for a structure of the color filter, i.e., a hole size and a lattice period of the transmissive pattern.

The LCD device according to the second embodiment of the present invention is a twisted nematic (TN) type LCD device for driving nematic liquid crystal molecules in a direction perpendicular to a substrate. However, the present invention is not limited to this.

The array substrate 210 according to the second embodiment of the present invention consists of a plurality of gate lines 216 and data lines 217 arranged in horizontal and vertical directions thereon to define a plurality of pixel regions. A thin film transistor (TFT), a switching device is formed at an intersection between the gate line 216 and the data line 217, and a pixel electrode 218 for driving an LC layer together with the common electrode 208 by being connected to the TFT is formed in the pixel region.

The TFT consists of a gate electrode 221 constituting a part of the gate line 216, a source electrode 222 connected to the data line 217, and a drain electrode 223 connected to the pixel electrode 218. The TFT further includes a first insulating layer (not shown) for insulating the gate electrode 221 and the source/drain electrodes 222 and 223 from each other, and an active layer (not shown) for forming a conductive channel between the source electrode 222 and the drain electrode 223 by a gate voltage applied to the gate electrode 221.

A part of the source electrode 222 is extending towards one direction to constitute a part of the data line 217. And, a part of the drain electrode 223 is extending towards the pixel region to be electrically connected to the pixel electrode 218 through a contact hole 240 of a second insulating layer (not shown).

The color filter 250 using a surface plasmon according to the second embodiment of the present invention is disposed on the array substrate 210. The color filter 250 has the transmissive pattern 253 formed in the metallic film 252 and consisting of a plurality of sub-wavelength holes having a predetermined period. An electric field of incident light having both a wavelength of near infrared light and a wavelength of visible light is coupled to a plasmon. Accordingly, only light of specific wavelengths is transmitted, and light of other wavelengths is reflected, thereby obtaining RGB colors.

The transmissive pattern 253 is formed in the pixel region except for a region where the gate line 216, the data line 217 and the TFT are formed.

The color filter 250 according to the second embodiment of the present invention has a hexagonal lattice structure where holes are periodically arranged. More concretely, the color filter 250 according to the second embodiment of the present invention has a hexagonal lattice structure in which six nearest holes are positioned around one hole of the transmissive pattern 253.

Here, a distance from the central hole to the nearest hole is equal to a lattice period, and a distance from the central hole to the next-nearest hole is 1.732 times of the lattice period.

As aforementioned, a cross-sectional shape of the holes of the transmissive pattern 253 may be one of a circular shape, a triangular shape, a square shape, an oval shape, and a shape of a slit having an aspect ratio more than 1. Preferably, the metallic film 252 is formed of aluminum which can cause a surface plasmon resonance on all regions of visible light. However, the present invention is not limited to this. For instance, the metallic film 252 may be formed of a conductive material including at least one selected from a group consisting of Au, Ag, Pt, Cu, Ni, Pd, Zn, Fe, Cr, Mo, a doped semiconductor device, carbon nanotube, fullerene, conductive plastic and a conductive composite material rather than Al, or may be formed of a conductive material selected from a group consisting of mixture thereof.

The holes of the transmissive pattern 253 preferably have a size of 100 nm~400 nm. However, the present invention is not limited to this. For instance, the holes may have a size of 50 nm~10 µm, and may have a period of 50 nm~10 µm.

The holes of the transmissive pattern 253 may be formed by the nano patterning method of the present invention. According to the nano patterning method, a surface plasmon color filter and an LCD device may be fabricated by using simplifying processes and reducing fabrication costs.

FIGS. 14A to 14F are sectional views sequentially showing processes for fabricating the LCD device shown in FIG. 12, and FIGS. 15A to 15E are planar views sequentially showing processes for fabricating the array substrate shown in FIG. 13.

Figure 14D:
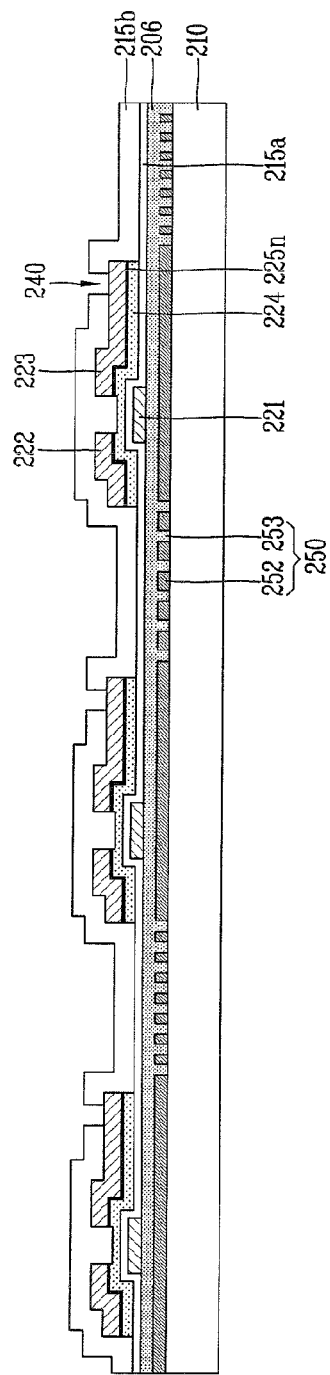
Figure 15A:
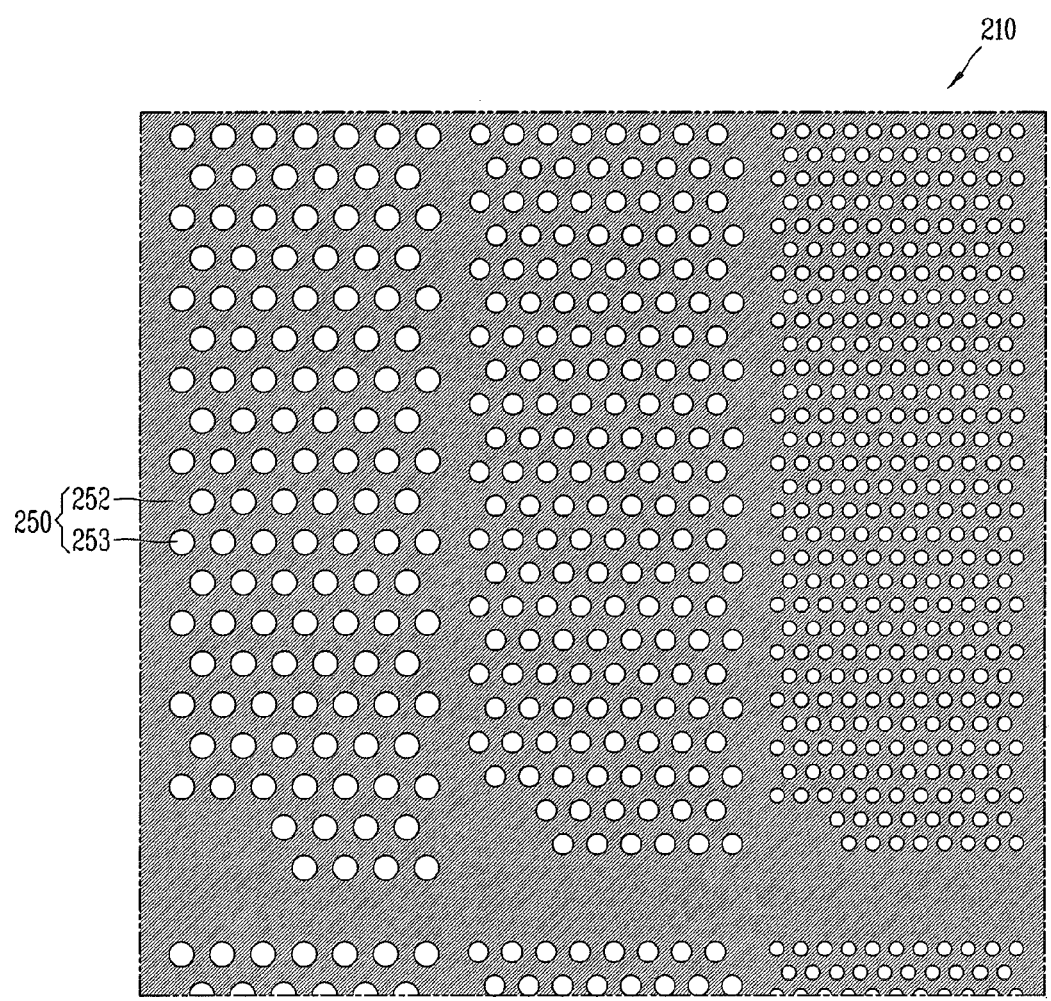
FIGS. 15A to 15E are planar views sequentially showing processes for fabricating the array substrate shown in FIG. 13.

As shown in FIGS. 14A and 15A, the surface plasmon color filter 250 according to the second embodiment of the present invention is formed on the array substrate 210 formed of a transparent insulating material such as glass.

The transmissive pattern 253 consisting of a plurality of sub-wavelength holes having a predetermined period (L) is formed in the metallic film 252. An electric field of incident light having both a wavelength of near infrared light and a wavelength of visible light is coupled to a plasmon. Accordingly, only light of specific wavelengths is transmitted, and light of other wavelengths is reflected, thereby obtaining RGB colors.

The surface plasmon color filter 250 according to the second embodiment of the present invention has a hexagonal lattice structure where six nearest holes are positioned around one hole of the transmissive pattern 253.

Here, a distance from the central hole to the nearest hole is equal to a lattice period, and a distance from the central hole to the next-nearest hole is 1.732 times of the lattice period.

As aforementioned, a cross-sectional shape of the holes of the transmissive pattern 253 may be one of a circular shape, a triangular shape, a square shape, an oval shape, and a shape of a slit having an aspect ratio more than 1. Preferably, the metallic film 252 is formed of aluminum which can implement a surface plasmon resonance on all regions of visible light. However, the present invention is not limited to this. For instance, the metallic film 252 may be formed of a conductive material including at least one selected from a group consisting of Au, Ag, Pt, Cu, Ni, Pd, Zn, Fe, Cr, Mo, a doped semiconductor device, carbon nanotube, fullerene, conductive plastic and a conductive composite material rather than Al, or may be formed of a conductive material selected from a group consisting of mixture thereof.

The holes of the transmissive pattern 253 preferably have a size of 100 nm~300 nm. However, the present invention is not limited to this. For instance, the holes may have a size of 50 nm~10 µm, and may have a period of 50 nm 10 µm.

Here, the surface plasmon color filter 250 is formed by using the nano patterning method of the present invention.

A dielectric material having a refractive index equal to or similar to that of the array substrate 210 is deposited above the metallic film 252 including the transmissive pattern 253, thereby forming an insulating layer 206 for planarizing the surface of the color filter 250.

The surface plasmon color filter 250 implements RGB colors as the transmissive pattern 253 consisting of a plurality of sub-wavelength holes having a constant period is formed in the metallic film 252.

The color filter 250 according to the second embodiment of the present invention implements RGB colors by selectively transmitting a red color through a red color transmissive pattern inside a red color region, by selectively transmitting a green color through a green color transmissive pattern inside a green color region, and by selectively transmitting a blue color through a blue color transmissive pattern inside a blue color region.

Figure 15B:
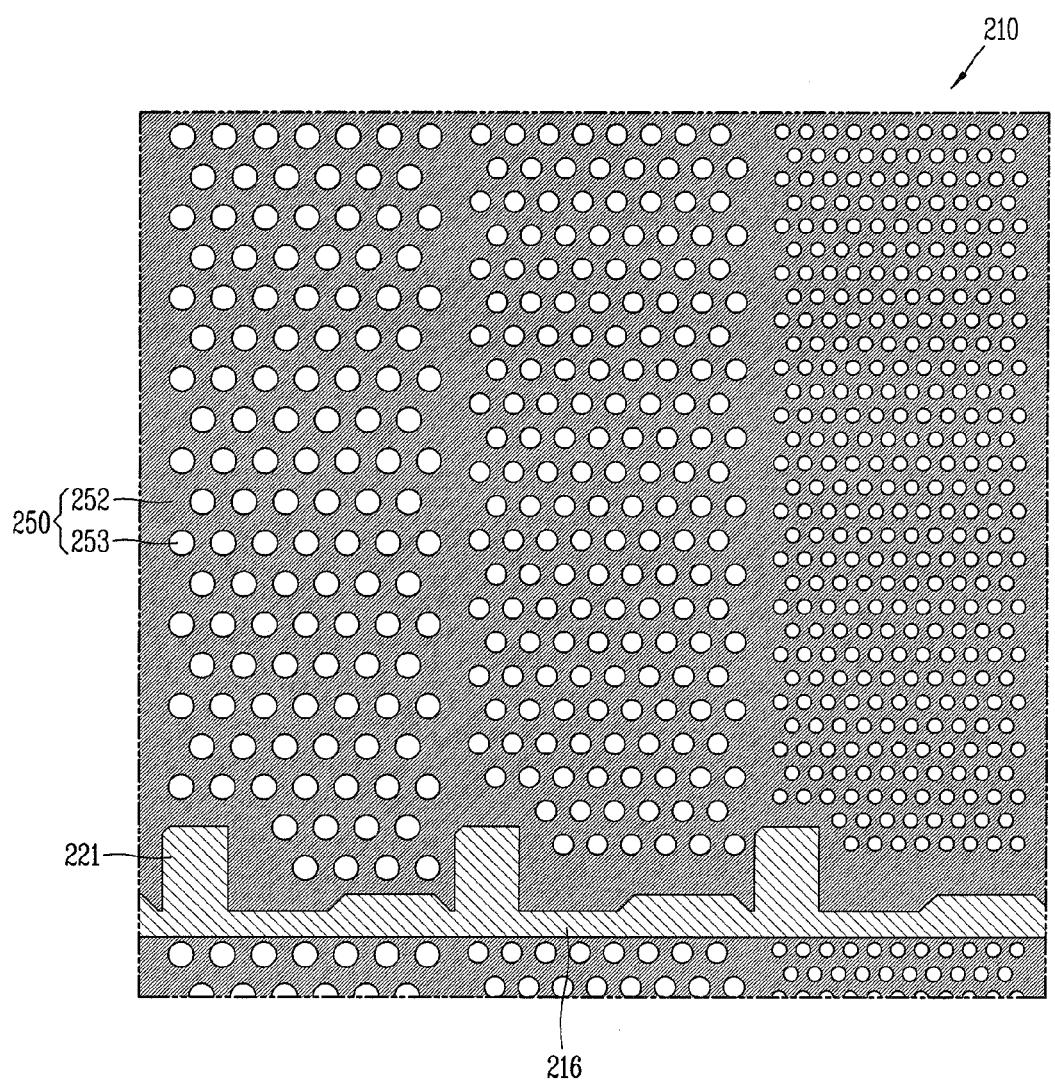

As shown in FIGS. 14B and 15B, a gate electrode 221 and a gate line 216 are formed on the array substrate 210 having the insulating layer 206 formed thereon.

Here, the gate electrode 221 and the gate line 216 are formed by depositing a first conductive film on the entire surface of the array substrate 210, and then by selectively patterning the first conductive film by a photolithography process.

The first conductive film may be formed of an opaque conductive material having a low resistance, such as aluminum (Al), Al alloy, tungsten (W), copper (Cu), chromium (Cr), molybdenum (Mo), and Mo alloy. Alternatively, the first conductive film may be formed to have a multi-structure implemented as at least two of the above materials are laminated on each other.

Figure 15C:
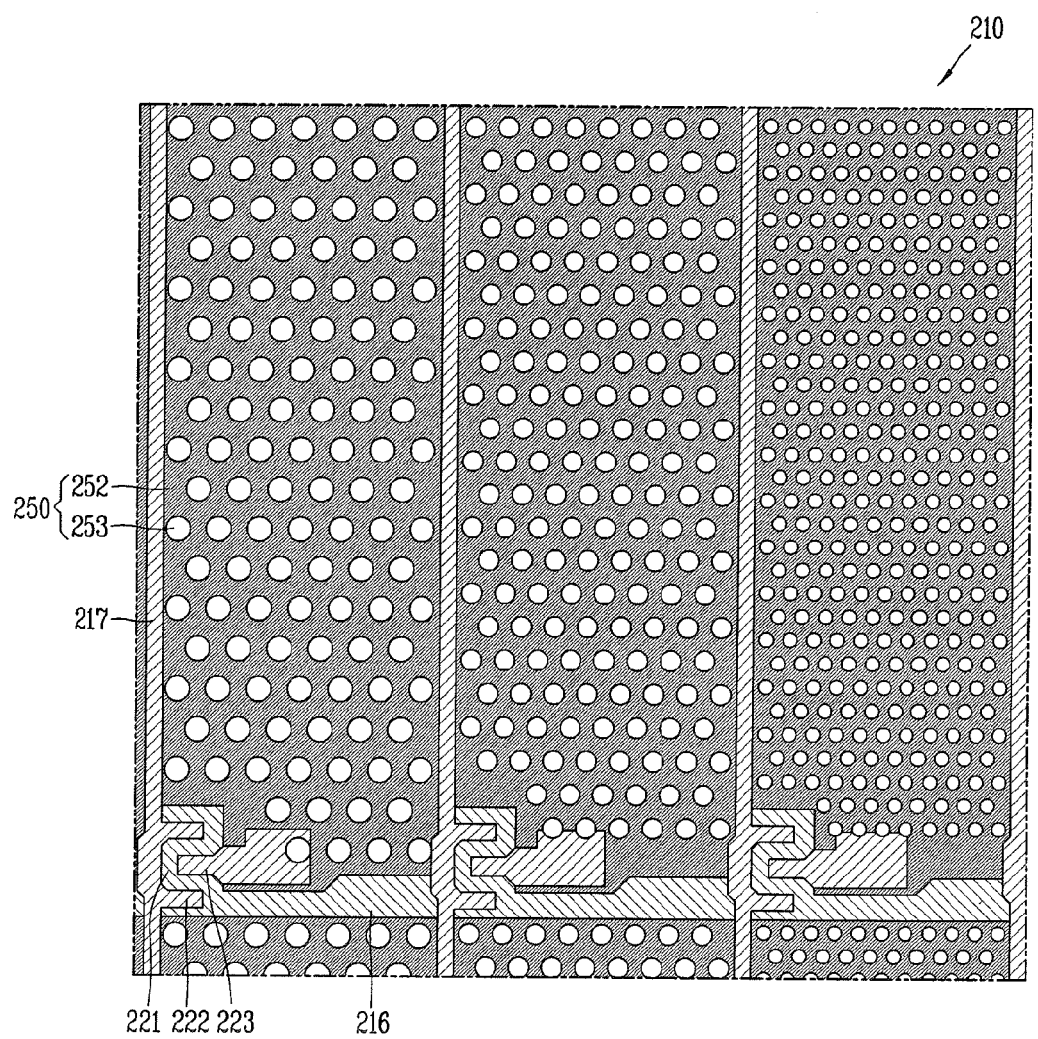

As shown in FIGS. 14C and 15C, on the entire surface of the array substrate 210 having the gate electrode 221 and the gate line 216 formed thereon, a first insulating layer 215a, an amorphous silicon thin film, an n+ amorphous silicon thin film, and a second conductive film are deposited, and then are selectively removed by a photolithography process. As a result, on the array substrate 210, formed are an active layer 224 formed of the amorphous silicon thin film, and source/drain electrodes 222 and 223 formed of the second conductive film and electrically connected to source/drain regions of the active layer 224.

A data line 217 formed of the second conductive film and crossing the gate line 216 to define a pixel region is formed by the photolithography process.

An ohmic contact layer 225n formed of the n+ amorphous silicon thin film and patterned in the same shape as the source/drain electrodes 222 and 223 is formed above the active layer 224.

An amorphous silicon thin film pattern (not shown) and an n+ amorphous silicon thin film pattern (not shown), each formed of the amorphous silicon thin film and the n+ amorphous silicon thin film, respectively, and each patterned in the same shape as the data line 217 are formed below the data line 217.

The active layer 224, the source/drain electrodes 222 and 223, and the data line 217 according to the second embodiment of the present invention may be simultaneously formed by a single mask process using a half-tone mask or a diffraction mask.

The second conductive film may be formed of an opaque conductive material having a low resistance, such as aluminum (Al), Al alloy, tungsten (W), copper (Cu), chromium (Cr), molybdenum (Mo), and Mo alloy, so as to constitute the source/drain electrodes 222 and 223 and the data line 217. Alternatively, the second conductive film may be formed to have a multi-structure implemented as at least two of the above materials are laminated on each other.

Figure 15D:
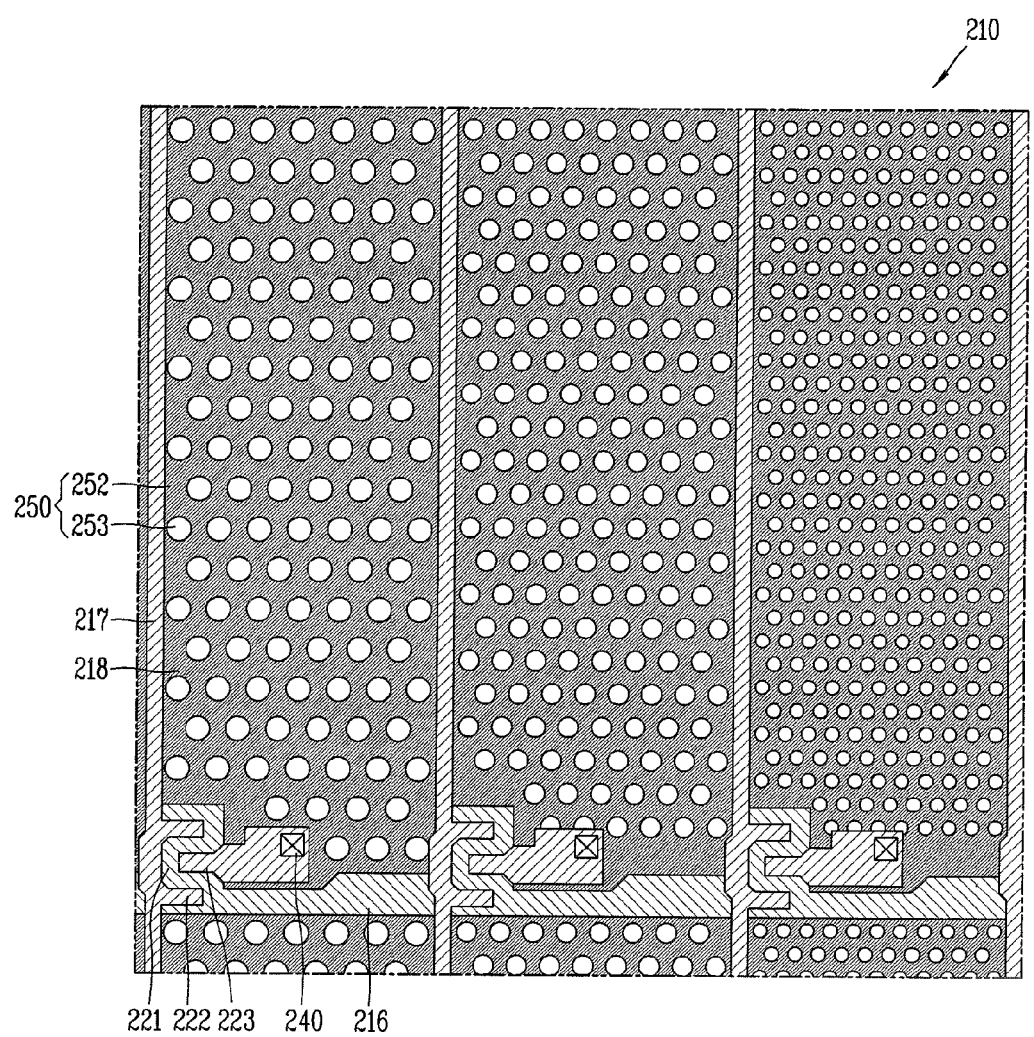

As shown in FIGS. 14D and 15D, a second insulating layer 215b is formed on the entire surface of the array substrate 210 having the active layer 224, the source/drain electrodes 222 and 223, and the data line 217 formed thereon. Then, the second insulating layer 215b is selectively removed by a photolithography process, thereby forming, on the array substrate 210, a contact hole 240 exposing a part of the drain electrode 223.

The second insulating layer 215b may be formed of an inorganic insulating layer such as silicon nitride or silicon oxide, or may be formed of an organic insulating layer such as photoacryl or benzocyclobutene (BCB).

Figure 14E:
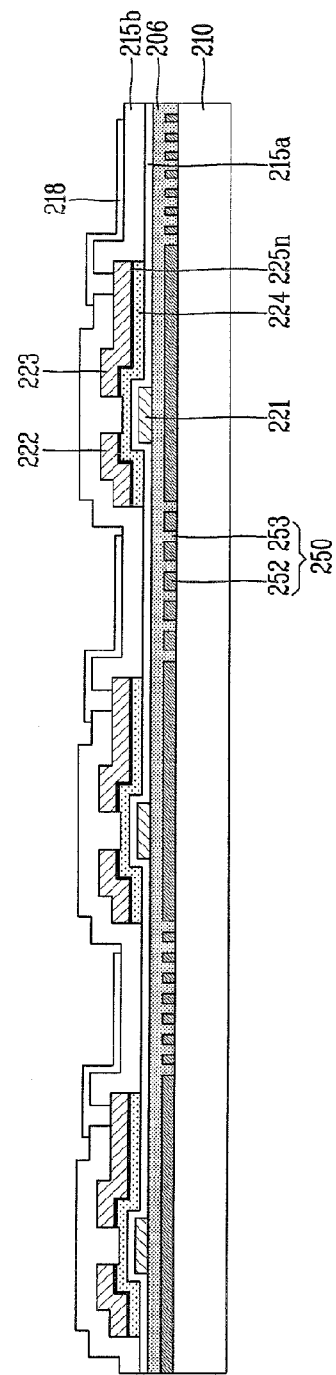
Figure 15E:
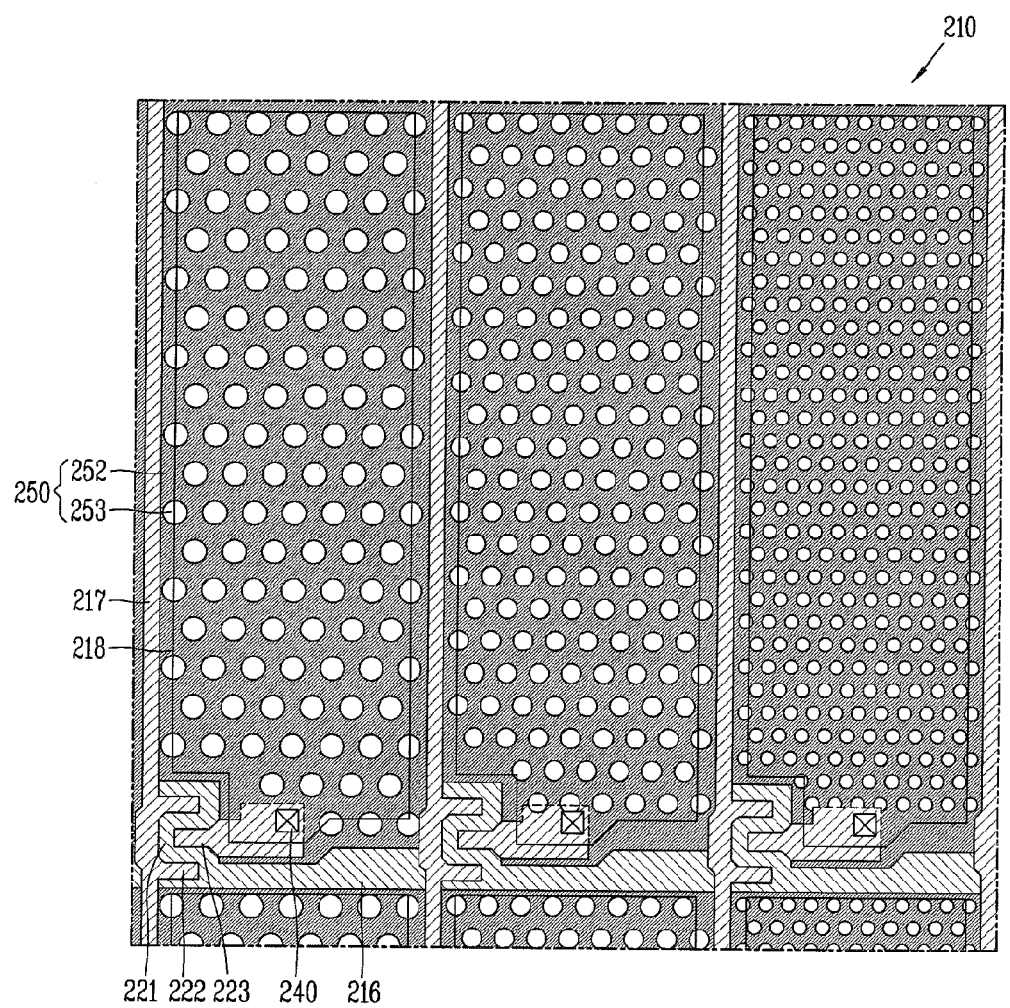

As shown in FIGS. 14E and 15E, a third conductive film is formed on the entire surface of the array substrate 210 having the second insulating layer 215b formed thereon, and then is selectively removed by a photolithography process. As a result, formed is a pixel electrode 218 electrically connected to the drain electrode 223 through the contact hole 240.

Here, the third conductive film includes a transparent conductive material having a high transmittance rate, such as Indium Tin Oxide (ITO) or Indium Zinc Oxide (IZO) so as to constitute the pixel electrode.

Figure 14F:
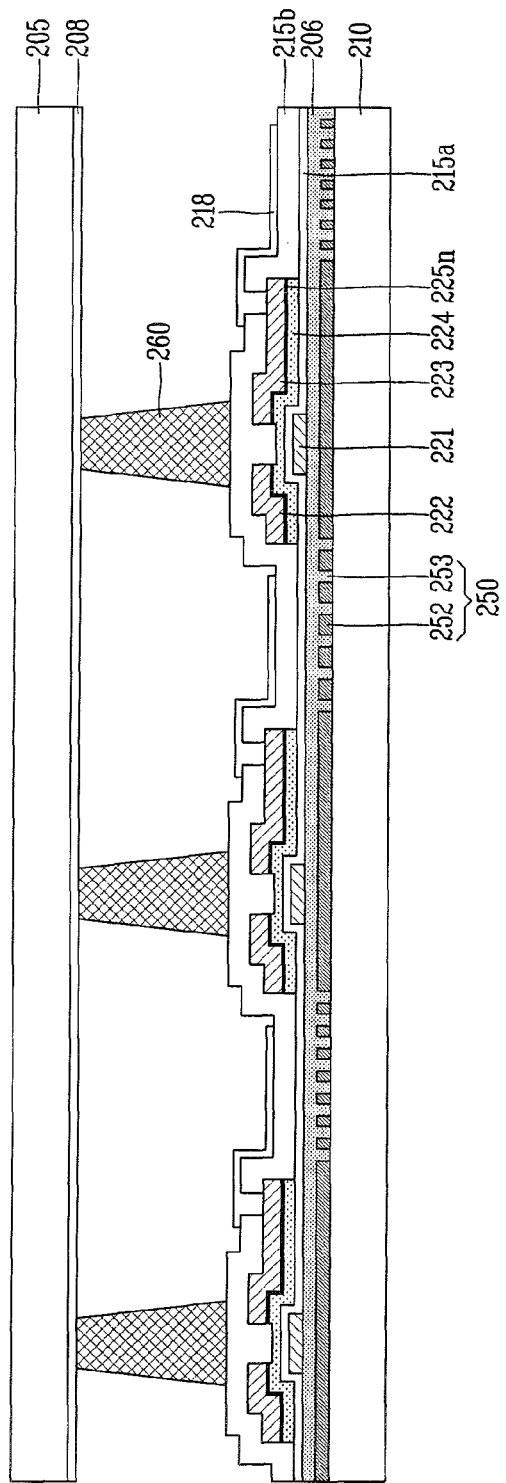

As shown in FIG. 14F, the array substrate 210 according to the second embodiment of the present invention is bonded to the color filter substrate 205 with facing each other, by a sealant (not shown) formed on an outer periphery of an image display region, in a state that a constant cell gap is maintained therebetween by a column spacer 260.

A common electrode 208 rather than a color filter and a black matrix may be formed on the color filter substrate 205.

In the first and second embodiments, it was explained that the present invention was applied to an amorphous silicon thin film transistor using an amorphous silicon thin film as an active pattern. However, the present invention is not limited to this. That is, the present invention may be also applied to a polycrystalline silicon thin film transistor using a polycrystalline silicon thin film as an active pattern, and an oxide thin film transistor using an oxide semiconductor device as an active layer.

The present invention may be applied not only to an LCD device, but also to other display devices fabricated by using thin film transistors, e.g., an OLED display device in which Organic Light Emitting Diodes (OLED) are connected to driving transistors.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A nano patterning method, comprising:
   forming a polymer film having an electrification property on a surface of a stamp having convexed portions;
   contacting the stamp having the polymer film formed thereon, on a surface of a substrate, and applying a voltage between a metal layer of the stamp and the substrate;
   separating the stamp from the substrate, and transferring, onto the substrate, a remaining polymer film having an electrification region charged with negative charges (−) or positive charges (+);
   immersing the substrate including the remaining polymer film in a solution where thiol-terminated nanospheres are dissolved, thereby forming a nanosphere colloidal monolayer on a surface of the remaining polymer film in a self assembly manner;
   removing polymers absorbed to surfaces of the nanospheres, and an exposed portion of the polymer film except for a portion covered by the nanospheres;
   depositing a predetermined thin film on an entire surface of the substrate including a pattern of the nanospheres; and
   selectively removing the nanospheres and the thin film deposited above the nanospheres, thereby forming, on the substrate, a plurality of nano holes arranged in a hexagonal lattice with a predetermined period.

2. The method of claim 1, wherein the thiol-terminated nanospheres are dissolved in a toluene solution.

3. The method of claim 1, wherein the thiol-terminated nanospheres are provided with length-controllable polymers absorbed on surfaces thereof.

4. The method of claim 3, wherein a gap between the nanospheres is controlled by controlling a length of the polymers.

5. The method of claim 1, wherein the thin film includes a material layer having a property of one of a conductor, a semiconductor device and a dielectric substance, or a combined property thereof.

6. The method of claim 1, wherein the nanospheres are formed of one selected from a group consisting of Si, Au, Ag, Cu and polystyrene.

7. A method for fabricating a surface plasmon color filter, the method comprising:
   forming a polymer film having an electrification property on a surface of a stamp having convexed portions;
   contacting the stamp having the polymer film formed thereon, on a surface of a substrate, and applying a voltage between a metal layer of the stamp and the substrate;
   separating the stamp from the substrate, and transferring, onto the substrate, a remaining polymer film having an electrification region charged with negative charges (−) or positive charges (+);
   immersing the substrate including the remaining polymer film in a solution where thiol-terminated nanospheres are dissolved, thereby forming a nanosphere colloidal monolayer on a surface of the remaining polymer film in a self assembly manner;
   removing polymers absorbed to surfaces of the nanospheres, and an exposed portion of the polymer film except for a portion covered by the nanospheres;
   depositing a conductive film on an entire surface of the substrate including a pattern of the nanospheres; and
   selectively removing the nanospheres and the conductive film deposited above the nanospheres, thereby forming, on the substrate, a plurality of nano holes arranged in a hexagonal lattice with a predetermined period,
   wherein a desired color is implemented by selectively transmitting light of a specific wavelength, by forming, in a metallic film formed of the conductive film, a transmissive pattern consisting of the plurality of nano holes having a predetermined period.

8. The method of claim 7, wherein the polymer film is formed of one selected from a group consisting of polydimethylsiloxane (PDMS) and polymethylmetaacrylate (PMMA).

9. The method of claim 7, wherein the stamp is implemented as a metallic layer having convexed portions on a glass substrate.

10. The method of claim 7, wherein the convexed portions of the stamp have a shape corresponding to sub color filters of red, green and blue of a surface plasmon color filter to be formed.

11. The method of claim 7, wherein the nanospheres are formed of one selected from a group consisting of Si, Au, Ag, Cu, and polystyrene, or are formed of mixture including at least one thereof.

12. The method of claim 7, wherein the thiol-terminated nanospheres are dissolved in a solution.

13. The method of claim 7, wherein the thiol-terminated nanospheres are provided with length-controllable polymers absorbed on surfaces thereof.

14. The method of claim 7, wherein the metallic film is formed of a conductive material including at least one selected from a group consisting of Al, Au, Ag, Pt, Cu, Ni, Pd, Zn, Fe, Cr, Mo, a doped semiconductor device, carbon nanotube, fullerene, conductive plastic and a conductive composite material, or is formed of a conductive material selected from a group consisting of mixture thereof.

15. The method of claim 7, wherein the transmissive pattern has a hexagonal lattice structure in which six nearest holes are positioned around one hole.

16. The method of claim 7, wherein the polymers of the nanospheres and the exposed polymer film are removed by a Reactive Ion Etching (RIE) or an oxygen ($O_2$) plasma etching.

17. The method of claim 7, wherein the nanospheres and the conductive film deposited above the nanospheres are removed by using a solvent.

18. The method of claim 7, wherein a hole size and a lattice period of the surface plasmon color filter are controlled by controlling a diameter of the nanospheres and a length of the polymers, thereby forming sub color filters corresponding to red, green and blue.

19. A method for fabricating a liquid crystal display (LCD) device, the method comprising:
   preparing a first substrate and a second substrate;
   forming a polymer film having an electrification property on a surface of a stamp having convexed portions;
   contacting the stamp having the polymer film formed thereon, on a surface of the first substrate, and applying a voltage between a metal layer of the stamp and the first substrate;
   separating the stamp from the first substrate, and transferring, onto the first substrate, a remaining polymer film having an electrification region charged with negative charges (−) or positive charges (+);
   immersing the first substrate including the remaining polymer film in a solution where thiol-terminated nanospheres are dissolved, thereby forming a nanosphere colloidal monolayer on a surface of the remaining polymer film in a self assembly manner;
   removing polymers absorbed to surfaces of the nanospheres, and an exposed portion of the polymer film except for a portion covered by the nanospheres;
   depositing a conductive film on an entire surface of the first substrate including a pattern of the nanospheres;
   selectively removing the nanospheres and the conductive film deposited above the nanospheres, thereby forming, on the first substrate, a plurality of nano holes arranged in a hexagonal lattice with a predetermined period, wherein a color filter for implementing a desired color by selectively transmitting light of a specific wavelength is formed by forming, in a metallic film formed of the conductive film, a transmissive pattern consisting of the plurality of nano holes having a predetermined period;
   forming a thin film transistor (TFT) on the color filter; and
   bonding the first and second substrates to each other.

20. A method for fabricating a liquid crystal display (LCD) device, the method comprising:
   preparing a first substrate and a second substrate;
   forming a thin film transistor (TFT) on the first substrate;
   forming a polymer film having an electrification property on a surface of a stamp having convexed portions;
   contacting the stamp having the polymer film formed thereon, on a surface of the second substrate, and applying a voltage between a metal layer of the stamp and the second substrate;
   separating the stamp from the second substrate, and transferring, onto the second substrate, a remaining polymer film having an electrification region charged with negative charges (−) or positive charges (+);
   immersing the second substrate including the remaining polymer film in a solution where thiol-terminated nanospheres are dissolved, thereby forming a nanosphere colloidal monolayer on a surface of the remaining polymer film in a self assembly manner;

removing polymers absorbed to surfaces of the nanospheres, and an exposed portion of the polymer film except for a portion covered by the nanospheres;

depositing a conductive film on an entire surface of the second substrate including a pattern of the nanospheres;

selectively removing the nanospheres and the conductive film deposited above the nanospheres, thereby forming, on the second substrate, a plurality of nano holes arranged in a hexagonal lattice with a predetermined period, wherein a color filter for implementing a desired color by selectively transmitting light of a specific wavelength is formed by forming, in a metallic film formed of the conductive film, a transmissive pattern consisting of the plurality of nano holes having a predetermined period; and bonding the first and second substrates to each other.

* * * * *